US010402001B2

(12) United States Patent
Kim et al.

(10) Patent No.: US 10,402,001 B2
(45) Date of Patent: Sep. 3, 2019

(54) ELECTRONIC DEVICE HAVING FORCE TOUCH FUNCTION

(71) Applicant: LG Display Co., Ltd., Seoul (KR)

(72) Inventors: JuHan Kim, Bucheon-si (KR); CheolSe Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 95 days.

(21) Appl. No.: 15/784,466

(22) Filed: Oct. 16, 2017

(65) Prior Publication Data

US 2018/0121002 A1 May 3, 2018

(30) Foreign Application Priority Data

Oct. 31, 2016 (KR) ........................ 10-2016-0143931

(51) Int. Cl.

*G06F 3/041* (2006.01)
*G06F 3/044* (2006.01)
*H01L 27/32* (2006.01)
*H01L 51/52* (2006.01)
*G09G 3/3225* (2016.01)

(52) U.S. Cl.

CPC ............ *G06F 3/0414* (2013.01); *G06F 3/044* (2013.01); *G06F 3/0412* (2013.01); *G06F 3/0416* (2013.01); *H01L 27/323* (2013.01); *H01L 51/5237* (2013.01); *H01L 51/5253* (2013.01); *G06F 2203/04111* (2013.01); *G09G 3/3225* (2013.01); *G09G 2310/08* (2013.01)

(58) Field of Classification Search

CPC combination set(s) only.
See application file for complete search history.

(56) References Cited

U.S. PATENT DOCUMENTS

2011/0032210 A1* 2/2011 Chou .................... G06F 3/0416 345/174
2011/0157069 A1* 6/2011 Zhuang .................. G06F 3/044 345/174
2013/0021295 A1 1/2013 Kimura et al.
2013/0265256 A1 10/2013 Nathan et al.
2015/0130742 A1* 5/2015 Chen ...................... G06F 3/044 345/174
2016/0026315 A1* 1/2016 Choi .................... G06F 3/0414 345/174
2016/0062504 A1 3/2016 Hwang et al.
2016/0062537 A1 3/2016 Kim et al.
2016/0349887 A1 12/2016 Wang
2017/0262112 A1* 9/2017 Noguchi ................ G06F 3/044
2018/0059480 A1* 3/2018 Noguchi ............ G02F 1/13338
2018/0088708 A1* 3/2018 Naganuma ........... G06F 3/0412

FOREIGN PATENT DOCUMENTS

EP 2555088 A1 2/2013
EP 2990913 A1 3/2016
WO 2016/107034 A1 7/2016

* cited by examiner

*Primary Examiner* — Bryan Earles
(74) *Attorney, Agent, or Firm* — Morgan, Lewis & Bockius LLP

(57) ABSTRACT

Disclosed is an electronic device having a force touch function, which has a thin thickness despite having the force touch function. The electronic device includes a substrate, first and second electrodes and a light emitting device layer including a light emitting layer provided on the substrate, and a touch electrode part on the second electrode. A distance between the second electrode and the touch electrode part is changeable according to a touch force applied to the touch electrode part.

13 Claims, 11 Drawing Sheets

ELECTRONIC DEVICE HAVING FORCE TOUCH FUNCTION

CROSS-REFERENCE TO RELATED APPLICATIONS

This application claims the benefit of the Korean Patent Application No. 10-2016-0143931 filed on Oct. 31, 2016.

BACKGROUND

Technical Field

The present disclosure relates to an electronic device having a force touch function.

Discussion of the Related Art

General organic light emitting display devices each include an organic light emitting display panel where a plurality of pixels each including an organic light emitting device provided between an anode electrode and a cathode electrode are arranged. The organic light emitting device includes a plurality of organic layers each including a light emitting layer. In the organic light emitting device, a hole injected from the anode electrode and an electron injected from the cathode electrode are recombined to generate an exciton, and light having a specific wavelength is emitted with energy which is generated when the exciton is shifted from an excited state to a ground state.

Recently, as a user interface environment such as applications requiring three-dimensional (3D) touch information based on a touch force as well as two-dimensional (2D) touch information based on a touch position is established, organic light emitting display devices having a force touch function and smartphones including the same are being researched and developed.

A related art organic light emitting display device having a force touch function senses a capacitance variation of a touch electrode of a touch panel disposed on an organic light emitting display panel to generate 2D touch information, and senses a change in a gap between a housing and a force sensor attached on a rear surface of the organic light emitting display panel to generate 3D touch information based on a touch force.

However, in the related art organic light emitting display device having the force touch function, a thickness increases due to the gap between the force sensor and the housing as well as a thickness of the force sensor, and since the related art organic light emitting display device includes a separate force sensor and a separate force touch driving integrated circuit (IC) for sensing a touch force, a structure is complicated, and the number of elements and the manufacturing cost increase.

SUMMARY

Accordingly, embodiments of the present disclosure are directed to an electronic device having a force touch function that substantially obviates one or more of the problems due to limitations and disadvantages of the related art.

An aspect of the present disclosure is to provide an electronic device having a force touch function, which has a thin thickness despite having the force touch function.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electronic device having a force touch function.

In another aspect, an electronic device having a force touch function comprises a substrate; a first electrode disposed on the substrate; a light emitting device layer including a light emitting layer disposed on the first electrode; a second electrode disposed on the light emitting device layer; and a touch electrode part disposed on the second electrode, wherein a distance between the second electrode and the touch electrode part is changeable according to a touch force applied to the touch electrode part.

In one or more embodiments, the electronic device further comprises: a thickness variation member between the second electrode and the touch electrode part.

In one or more embodiments, the thickness variation member comprises an elastic barrier film.

In one or more embodiments, the elastic barrier film comprises an elastic film and a barrier film provided on the elastic film.

In one or more embodiments, the thickness variation member comprises an elastic supporting member separating the touch electrode part from the second electrode, and the elastic supporting member is arranged such that an air layer is provided between the touch electrode part and the second electrode.

In one or more embodiments, the thickness variation member comprises an elastic dielectric material.

In one or more embodiments, the thickness variation member comprises a plurality of elastic dielectric layers stacked in two or more layers, and the plurality of elastic dielectric layers have different elastic coefficients.

In one or more embodiments, an elastic dielectric layer of the plurality of elastic dielectric layers that is arranged closer to a touch surface of the electronic device has a lower elastic coefficient than an elastic dielectric layer of the plurality of elastic dielectric layers that is arranged farther away from the touch surface.

In one or more embodiments, the electronic device further comprises: an encapsulation layer covering the second electrode, wherein the thickness variation member is disposed between the encapsulation layer and the touch electrode part.

In one or more embodiments, the touch electrode part comprises: a transparent substrate attached on the thickness variation member; a plurality of touch electrodes provided on the transparent substrate; a plurality of touch routing lines respectively connected to the plurality of touch electrodes in a one-to-one relationship; and a touch pad part provided on the transparent substrate and connected to the plurality of touch routing lines in a one-to-one relationship, and the plurality of touch electrodes overlap the second electrode with the thickness variation member therebetween.

In one or more embodiments, the touch electrode part comprises: a plurality of touch electrodes directly provided on the thickness variation member; a plurality of touch routing lines respectively connected to the plurality of touch electrodes in a one-to-one relationship; and a touch pad part provided on the substrate and connected to the plurality of touch routing lines in a one-to-one relationship, and the plurality of touch electrodes overlap the second electrode with the thickness variation member therebetween.

In one or more embodiments, the touch electrode part comprises: a transparent substrate attached on the thickness variation member; a plurality of first touch electrodes provided on the transparent substrate; a plurality of second touch electrodes separated from the plurality of first touch electrodes and provided adjacent to the plurality of first touch electrodes on the transparent substrate; a plurality of first touch routing lines respectively connected to the plurality of first touch electrodes in a one-to-one relationship; a plurality of second touch routing lines respectively connected to the plurality of second touch electrodes in a one-to-one relationship; and a touch pad part provided on the transparent substrate and connected to the plurality of first touch routing lines and the plurality of second touch routing lines in a one-to-one relationship, and the plurality of first touch electrodes overlap the second electrode with the thickness variation member therebetween, and the plurality of second touch electrodes overlap the second electrode with the thickness variation member therebetween.

In one or more embodiments, the touch electrode part comprises: a plurality of first touch electrodes directly provided on the thickness variation member; a plurality of second touch electrodes separated from the plurality of first touch electrodes, directly provided on the thickness variation member, and disposed adjacent to the plurality of first touch electrodes; a plurality of first touch routing lines respectively connected to the plurality of first touch electrodes in a one-to-one relationship; a plurality of second touch routing lines respectively connected to the plurality of second touch electrodes in a one-to-one relationship; and a touch pad part provided on the substrate and connected to the plurality of first touch routing lines and the plurality of second touch routing lines in a one-to-one relationship, and the plurality of first touch electrodes overlap the second electrode with the thickness variation member therebetween, and the plurality of second touch electrodes overlap the second electrode with the thickness variation member therebetween.

In one or more embodiments, the electronic device further comprises: an organic light emitting display device on the substrate, the organic light emitting display device including the light emitting device layer and the touch electrode part; a housing accommodating the organic light emitting display device; and a cover window covering a front surface of the organic light emitting display device, the cover window being supported by the housing.

In one or more embodiments, the electronic device further comprises: an elastic member between the cover window and the housing.

In one or more embodiments, the electronic device further comprises: a touch driving circuit connected to the touch pad part, wherein the touch driving circuit is configured to: simultaneously supply a touch driving pulse to the plurality of touch electrodes through the plurality of touch routing lines and sense capacitance variations of the plurality of touch electrodes through the plurality of touch routing lines.

In one or more embodiments, the electronic device further comprises: a touch driving circuit connected to the touch pad part, wherein the touch driving circuit is configured to: during a first touch sensing period, supply a touch driving pulse to the plurality of touch electrodes through the plurality of touch routing lines and sense capacitance variations of the plurality of touch electrodes through the plurality of touch routing lines, and during a second touch sensing period, supply the touch driving pulse to the plurality of touch electrodes through the plurality of touch routing lines and sense capacitance variations of the plurality of touch electrodes through the plurality of touch routing lines.

In one or more embodiments, the electronic device further comprises: a touch driving circuit connected to the touch pad part, wherein the touch driving circuit is configured to sequentially supply a touch driving pulse to the plurality of first touch electrodes through the plurality of first touch routing lines, and immediately after the touch driving pulse is supplied, sense a capacitance variation of a corresponding first touch electrode through a corresponding first touch routing line, and the touch driving circuit is further configured to sequentially supply the touch driving pulse to the plurality of second touch electrodes through the plurality of second touch routing lines, and immediately after the touch driving pulse is supplied, sense a capacitance variation of a corresponding second touch electrode through a corresponding second touch routing line.

In one or more embodiments, the electronic device further comprises: a touch driving circuit connected to the touch pad part, wherein the touch driving circuit is configured to: during a first touch sensing period, sequentially supply a touch driving pulse to the first and second touch electrodes through the first and second touch routing lines, and immediately after the touch driving pulse is supplied, sense a capacitance variation of a corresponding touch electrode through a corresponding touch routing line, and during a second touch sensing period, sequentially supply the touch driving pulse to the first and second touch electrodes through the first and second touch routing lines, and immediately after the touch driving pulse is supplied, sense a capacitance variation of a corresponding touch electrode through a corresponding touch routing line.

In one or more embodiments, the electronic device further comprises: a touch driving circuit connected to the touch pad part, wherein the touch driving circuit is configured to: during a first touch sensing period, sequentially supply a touch driving pulse to the plurality of first touch electrodes through the plurality of first touch routing lines and individually sense capacitance variations between corresponding first touch electrodes and second touch electrodes through the plurality of second touch routing lines, and during a second touch sensing period, simultaneously supply the touch driving pulse to the plurality of second touch electrodes through the plurality of second touch routing lines, and immediately after the touch driving pulse is supplied, individually sense capacitance variations of the plurality of second touch electrodes through the plurality of second touch routing lines.

In one or more embodiments, the electronic device further comprises: a touch driving circuit connected to the touch pad part, wherein the touch driving circuit is configured to: during a first touch sensing period, sequentially supply a touch driving pulse to the plurality of first touch electrodes through the plurality of first touch routing lines and individually sense capacitance variations between corresponding first touch electrodes and second touch electrodes through the plurality of second touch routing lines, and during a second touch sensing period, sequentially supply the touch driving pulse to the first and second touch electrodes through the first and second touch routing lines, and immediately after the touch driving pulse is supplied, sense a capacitance variation of a corresponding touch electrode through a corresponding touch routing line.

Various embodiments provide an electronic device having a force touch function, including a substrate, first and second electrodes and a light emitting device layer provided on the substrate, the light emitting device layer including a light emitting layer and disposed between the first electrode and the second electrode, and a touch electrode part on the second electrode, wherein a distance between the second electrode and the touch electrode part is changeable according to a touch force applied to the touch electrode part.

The electronic device may further include a thickness variation member provided between the second electrode and the touch electrode part. The thickness variation member may be an elastic barrier film or an elastic dielectric material. The thickness variation member may be an elastic supporting member separating the touch electrode part from the second electrode, and the elastic supporting member may provide an air layer between the touch electrode and the second electrode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
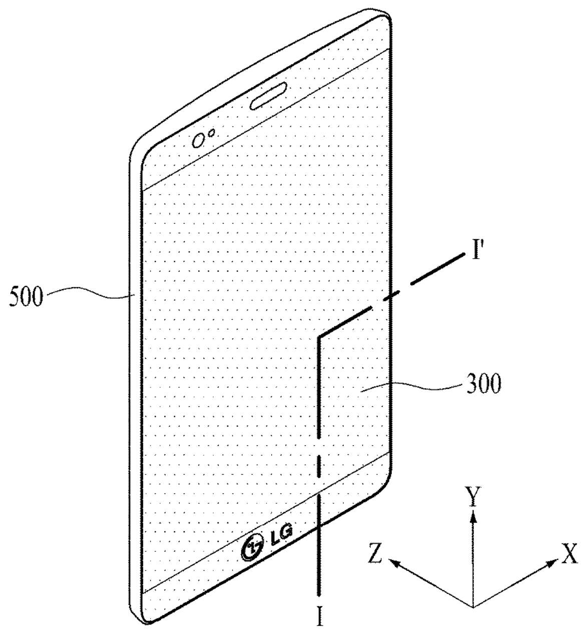
FIG. 1 is a perspective view illustrating an electronic device including an organic light emitting display device having a force touch function according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where ‘comprise’, ‘have’, and ‘include’ described in the present specification are used, another part may be added unless ‘only~’ is used. The terms of a singular form may include plural forms unless referred to the contrary.

In construing an element, the element is construed as including an error range although there is no explicit description.

In describing a position relationship, for example, when a position relation between two parts is described as ‘on~’, ‘over~’, ‘under~’, and ‘next~’, one or more other parts may be disposed between the two parts unless ‘just’ or ‘direct’ is used.

In describing a time relationship, for example, when the temporal order is described as ‘after~’, ‘subsequent~’, ‘next~’, and ‘before~’, a case which is not continuous may be included unless ‘just’ or ‘direct’ is used.

It will be understood that, although the terms “first”, “second”, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of an electronic device having a force touch function according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
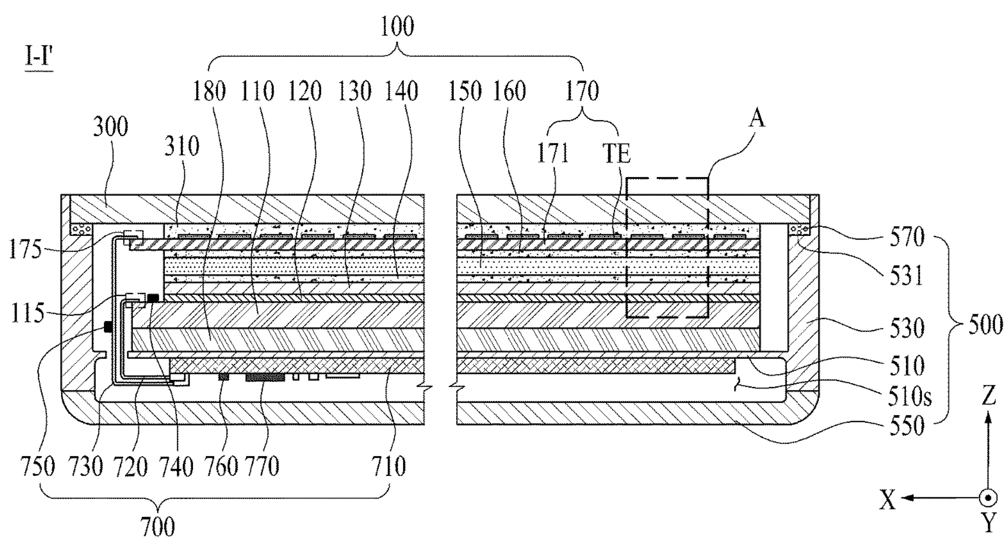
FIG. 2 is a cross-sectional view taken along line I-I' illustrated in FIG. 1.
Figure 3:
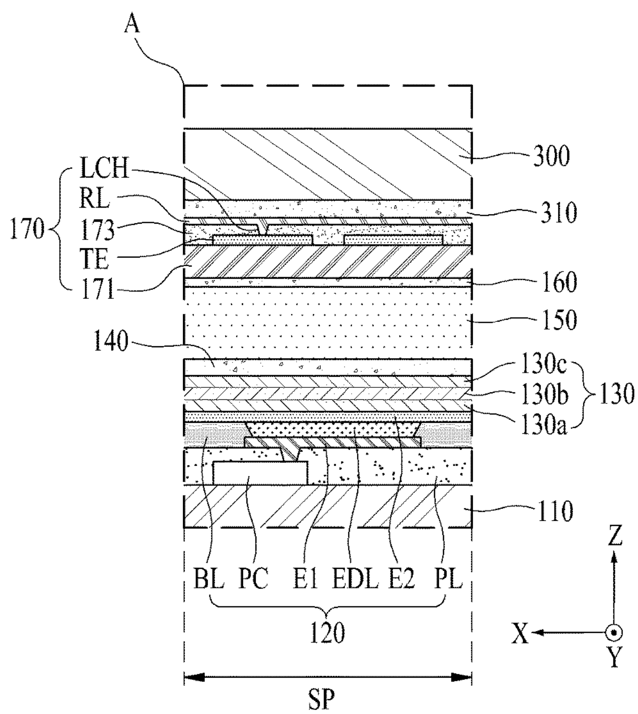
FIG. 3 is an enlarged view of portion A illustrated in FIG. 2.

FIG. 1 is a perspective view illustrating an electronic device including an organic light emitting display device having a force touch function according to an embodiment of the present disclosure, FIG. 2 is a cross-sectional view taken along line I-I' illustrated in FIG. 1, and FIG. 3 is an enlarged view of portion A illustrated in FIG. 2. In the following description, an electronic device having a force touch function may be referred to as an electronic device.

Referring to FIGS. 1 to 3, the electronic device according to an embodiment of the present disclosure may include an organic light emitting display device 100, a cover window 300, a housing 500, and a driving circuit unit 700.

The organic light emitting display device 100 according to an embodiment may perform a function of a touch panel that displays an image corresponding to a data signal supplied from the driving circuit unit 700, and simultaneously, senses a touch position and/or a touch force based on a user touch applied to a touch surface of the cover window 300. The organic light emitting display device 100 according to an embodiment may include a substrate 110, a pixel array layer 120, an encapsulation layer 130, a thickness variation member 150, and a touch electrode part 170.

The substrate 110, a base substrate, may include a plastic material, a glass material, and/or the like. Here, if the substrate 110 includes the plastic material, the substrate 110 may include opaque or colored polyimide (PI). The substrate 110 including polyimide may be manufactured by curing polyimide resin which is coated on a front surface of a release layer provided on a relatively thick carrier substrate to have a certain thickness. Here, the carrier glass substrate may be separated from the substrate 110 by releasing the release layer through a laser release process.

Additionally, if the substrate 110 includes the plastic material, the organic light emitting display device 100 according to the present embodiment may further include a back plate 180 which is coupled to a bottom of the substrate 110 with respect to a thickness direction Z (or a vertical axis direction). The back plate 180 may maintain the substrate 110 in a planar state. The back plate 180 according to an embodiment may include a plastic material, for example, polyethyleneterephthalate (PET). The back plate 180 may be laminated on the bottom of the substrate 110 separated from the carrier glass substrate, thereby maintaining the substrate 110 in a planar state.

The pixel array layer 120 may include a plurality of pixels SP that are provided on the substrate 110 to display an image.

The plurality of pixels SP may be respectively provided in a plurality of pixel areas defined by a plurality of gate lines, a plurality of data lines, and a plurality of pixel driving power lines. Each of the plurality of pixels SP may be a minimum-unit area that actually emits light, and may be defined as a subpixel. At least three adjacent pixels SP may configure one unit pixel for displaying colors. For example, the one unit pixel may include a red pixel, a green pixel, and a blue pixel which are adjacent to each other, and may further include a white pixel so as to enhance luminance.

The plurality of pixels SP according to an embodiment may each include a pixel circuit PC, a planarization layer PL, a first electrode E1, a bank layer BL, a light emitting device layer EDL, and a second electrode E2.

The pixel circuit PC may be provided in a circuit area which is defined in a corresponding pixel SP, and may be connected to a gate line, a data line, and a pixel driving power line which are adjacent thereto. The pixel circuit PC may control a current flowing in the light emitting device layer EDL according to a data signal supplied through the data line in response to a scan pulse supplied through the gate line, based on a pixel driving power supplied through the pixel driving power line. The pixel circuit PC according to an embodiment may include a switching thin film transistor (TFT), a driving TFT, and a storage capacitor.

The TFT may include a gate electrode, a gate insulation layer, a semiconductor layer, a source electrode, and a drain electrode provided on the substrate 110. Here, the TFT may be an amorphous silicon (a-Si) TFT, a poly-Si TFT, an oxide TFT, an organic TFT, or the like.

The switching TFT may include a gate electrode connected to the gate line, a source electrode connected to the data line, and a drain electrode connected to a gate electrode of the driving TFT. Here, each of the source electrode and the drain electrode of the switching TFT may switch therebetween depending on a direction of a current. The switching TFT may be turned on according to the scan pulse supplied through the gate line to supply the data signal supplied through the data line to the driving TFT.

The driving TFT may be turned on by a voltage supplied through the switching TFT and/or a voltage of the storage capacitor to control an amount of current which flows from the pixel driving power line to the light emitting device layer EDL. To this end, the driving TFT according to an embodiment may include a gate electrode connected to the drain electrode of the switching TFT, a drain electrode connected to the pixel driving power line, and a source electrode connected to the first electrode E1 (thus, to the light emitting device layer EDL). The driving TFT may control a data current flowing from the pixel driving power line to the light emitting device layer EDL, based on the data signal supplied through the switch TFT, and thus, the light emitting device layer EDL may emit light having brightness proportional to the data signal.

The storage capacitor may be provided in an overlapping area between the gate electrode and the source electrode of the driving TFT. The storage capacitor may store a voltage corresponding to the data signal supplied to the gate electrode of the driving TFT and may turn on the driving TFT with the stored voltage.

In addition, the organic light emitting display device 100 according to the present embodiment may further include a scan driving circuit which is provided in a non-display area of the substrate 110. The scan driving circuit may generate a scan pulse according to a scan control signal supplied from the driving circuit unit 700 and may supply the scan pulse to a gate line corresponding to a predetermined order. The scan driving circuit according to an embodiment may be provided in an arbitrary non-display area, which enables the scan pulse to be supplied to the gate line, of a non-display area provided on the substrate 110 along with the TFT of the pixel SP.

The planarization layer PL may be provided on the substrate 110 to cover the pixel circuit PC and may provide a planarization surface on the substrate 110 where the TFT is provided.

The first electrode E1 may be provided in a pattern type on the planarization layer PL which overlaps an opening area defined in each of the pixel areas. The first electrode E1 may be connected to the source electrode of the driving TFT, provided in the pixel circuit PC, through a contact hole provided in the planarization layer PL, thereby receiving the data current output from the driving TFT. The first electrode E1 may be formed of a metal material, e.g. a metal material which is high in reflectivity, and for example, may include a material such as gold (Au), silver (Ag), aluminum (Al), molybdenum (Mo), magnesium (Mg), and/or the like, or may include an alloy thereof. However, the present embodiment is not limited thereto.

The bank layer BL may be provided on the planarization layer PL to cover an edge of the first electrode E1 and the pixel circuit PC to define the opening area of each pixel area. The bank layer BL according to an embodiment may include an organic material such as benzocyclobutene (BCB), acryl, polyimide, and/or the like. In an embodiment, the bank layer BL may be formed of a photosensitive material containing a black pigment. In this case, the bank layer BL may act as a light blocking member (or a black matrix).

The light emitting device layer EDL may be provided on the first electrode E1 in the opening area defined by the bank layer BL. That is, the light emitting device layer EDL may include a light emitting layer disposed between the first electrode E1 and the second electrode E2.

The light emitting device layer EDL may include a hole injection layer, a hole transport layer, an organic light emitting layer, an electron transport layer, and an electron injection layer which are sequentially stacked on the first electrode E1 with respect to the thickness direction Z. Here, one or two or more of the hole injection layer, the hole transport layer, the electron transport layer, and the electron injection layer may be omitted. Also, the light emitting device layer EDL may further include at least one function layer for controlling an electron and/or a hole injected into the organic light emitting layer.

The organic light emitting layer according to an embodiment may be provided to emit lights of different colors (for example, red, green, and blue) in each pixel. According to another embodiment, the organic light emitting layer may be formed to emit lights of the same color (for example, white) in each pixel, and in this case, the light emitting device layer EDL may include at least two organic light emitting layers emitting lights of opposite colors, e.g. complementary colors.

The second electrode E2 may be provided on the substrate 110 to cover the light emitting device layer EDL and the bank layer BL and may be connected to the light emitting device layer EDL of each pixel in common. The second electrode E2 may be defined as a cathode electrode or a common electrode depending on a direction of a current flowing in the light emitting device layer EDL. The second electrode E2 may receive a cathode power supplied from the driving circuit unit 700. Here, the cathode power may be a ground voltage or a direct current (DC) voltage having a certain level.

The second electrode E2 according to an embodiment may be formed of a transparent metal material, e.g. a transparent metal material which is high in light transmittance. The second electrode E2 may include a transparent conductive material, e.g. a transparent conductive oxide (TCO), e.g. indium tin oxide (ITO), indium zinc oxide (IZO), indium zinc tin oxide (IZTO), indium cesium oxide (ICO), or indium tungsten oxide (IWO). Optionally, in the present embodiment, the second electrode E2 may be formed of an amorphous transparent conductive material through a low temperature metal deposition process using a process temperature of less than 100 degrees C., for minimizing damage of the light emitting device layer EDL caused by a process temperature when forming the second electrode E2. That is, in a case where the second electrode E2 is formed of the crystalline transparent conductive material, the light emitting device layer EDL is damaged by a high temperature thermal treatment process which is performed on the second electrode E2 for securing a low resistance value, and thus, the second electrode E2 may be formed of an amorphous transparent conductive material through the low temperature metal deposition process.

The encapsulation layer 130 may be formed to cover the pixel array layer 120, for protecting the light emitting device layer EDL vulnerable to external water or oxygen by preventing the water from penetrating into each pixel SP. That is, the encapsulation layer 130 may be provided on the substrate 110 to cover the second electrode E2. The encapsulation layer 130 according to an embodiment may be formed of an inorganic material layer or an organic material layer, or may be formed in a multi-layer structure where an inorganic material layer and an organic material layer are alternately stacked.

The encapsulation layer 130 according to an embodiment may include a first inorganic layer 130*a* provided on the substrate 110 to cover the second electrode E2, an organic layer 130*b* covering the first inorganic layer 130*a*, and a second inorganic layer 130*c* covering the organic layer 130*b*.

The first inorganic layer 130*a* may be disposed closest to the light emitting device layer EDL and may be formed of an inorganic insulating material, e.g. an inorganic insulating material, which is capable of being deposited at a low temperature, such as silicon nitride (SiNx), silicon oxide (SiOx), silicon oxynitride (SiON), aluminum oxide (AlxOy), or the like. In this case, since the light emitting device layer EDL is vulnerable to a high temperature, the first inorganic layer 130*a* may be formed by a low temperature atmosphere, for example, a low temperature process of less than 100 degrees C. Accordingly, in the present embodiment, the light emitting device layer EDL is prevented from being damaged by a high temperature atmosphere applied to a process chamber when forming the first inorganic layer 130*a*.

The organic layer 130*b* may be provided on the substrate 110 to cover a whole portion of the first inorganic layer 130*a*. The organic layer 130*b* may act as a cushion relaxing a stress between layers caused by bending of the organic light emitting display device and may enhance planarization performance. The organic layer 130*b* according to an embodiment may include an organic material such as benzocyclobutadiene (BCB), acryl, polyimide, and/or the like.

The second inorganic layer 130*c* may be provided on the substrate 110 to cover a whole portion of the organic layer 130*b* and cover each of side surfaces of the first inorganic layer 130*a*. The second inorganic layer 130*c* primarily prevents water or oxygen from penetrating into the organic layer 130*b* and the first inorganic layer 130*a* from the outside. The second inorganic layer 130*c* according to an embodiment may be formed of an inorganic insulating material, e.g. an inorganic insulating material, which is capable of being deposited at a low temperature, such as SiNx, SiOx, SiON, or AlxOy, or may be formed of the same material as that of the first inorganic layer 130*a*.

The substrate 110, the pixel array layer 120, and the encapsulation layer 130 may configure an organic light emitting display panel.

The thickness variation member 150 may be disposed between the second electrode E2 and the touch electrode part 170, and a thickness thereof may be changed according to a touch force (or a touch pressure) applied to the touch electrode part 170. For example, the thickness variation member 150 may be an elastic barrier film which may be adhered to a front surface of the encapsulation layer 130, e.g. by a first transparent adhesive member 140. Here, the first transparent adhesive member 140 may be an optical clear adhesive (OCA), an optical clear resin (OCR), or the like.

Figure 4:
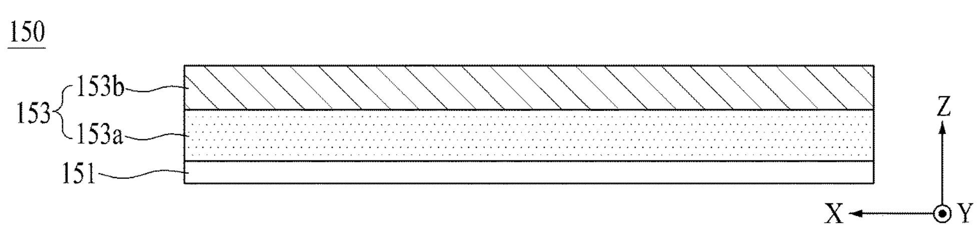
FIG. 4 is a cross-sectional view for describing a thickness variation member illustrated in FIGS. 2 and 3.

The thickness variation member 150 according to an embodiment, as illustrated in FIG. 4, may include a base film 151 and an elastic barrier film 153 provided on the base film 151.

The base film 151 may include one of polyethyleneterephthalate, polyethersulfone, polyimide, polynorbomene, polycarbonate, and polyethylenenaphthalate.

The elastic barrier film 153 may have a barrier characteristic of preventing penetration of water or oxygen from the outside and an elastic characteristic where a thickness is changed according to a touch force (or a touch pressure) applied to the touch electrode part 170, and moreover, may have a light transmittance characteristic of 90% or more for transmitting light emitted from each pixel SP.

The elastic barrier film 153 according to an embodiment may include an elastic film 153*a* provided on the base film 151 and a barrier film 153*b* provided on the elastic film 153*a*.

The elastic film 153*a* may be formed of an elastic material having a thickness which is changed according to a touch force (or a touch pressure) applied to the touch electrode part 170. For example, the elastic material may be acrylic resin, olefin resin, synthetic rubber, elastic silicon, or a compound of two or more materials thereof, but is not limited thereto.

The barrier film 153*b* may have a barrier characteristic of preventing penetration of water or oxygen from the outside and may be formed of a transparent polymer material. For example, the transparent polymer material may be polycarbonate, polyimide, polyethylene, polyethyleneterephthalate, polypropylene, or a compound of two or more materials thereof, but is not limited thereto.

Alternatively, the elastic barrier film 153 may be formed of a single film which includes a compound material where the elastic material of the elastic film 153*a* and the polymer material of the barrier film 153*b* are mixed.

Referring again to FIGS. 1 to 3, the touch electrode part 170 may sense a touch position and/or a touch force based on a user touch applied to a touch surface of the cover window 300 and may be provided on the thickness variation member 150. The touch electrode part 170 may be a touch panel which may be attached on a front surface of the thickness variation member 150, e.g. by a second transparent adhesive member 160. Here, the transparent adhesive member 150 may be an OCA, an OCR, or the like.

Figure 5:
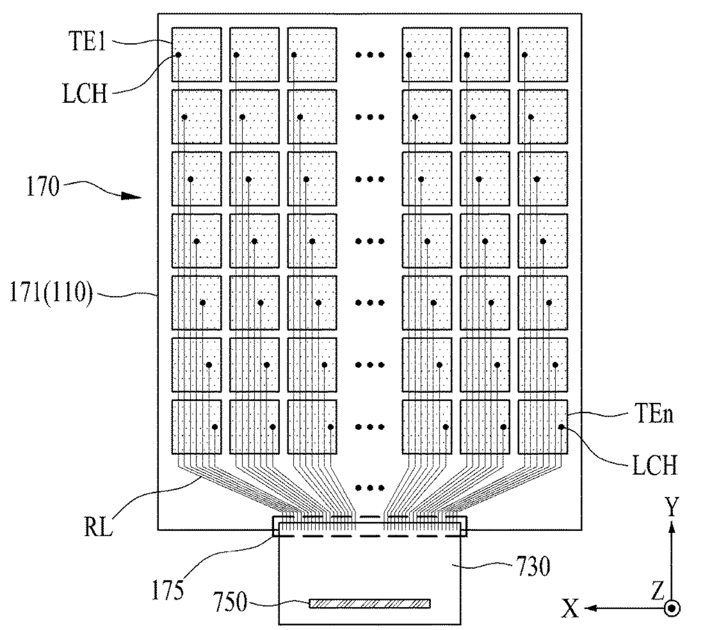
FIG. 5 is a plan view for describing a touch electrode part illustrated in FIGS. 2 and 3.

The touch electrode part 170 according to an embodiment, as illustrated in FIG. 5, may include a transparent substrate 171, a plurality of touch electrodes TE1 to TEn, an insulation layer 173, a plurality of touch routing lines RL, and a touch pad part 175.

The transparent substrate 171 may be attached on the front surface of the thickness variation member 150 by the transparent adhesive member 150. The transparent substrate 171 according to an embodiment may include one of polyethyleneterephthalate, polyethersulfone, polyimide, polynorbornene, polycarbonate, polyethylenenaphthalate, etc.

The plurality of touch electrodes TE1 to TEn may be arranged at certain intervals along a first direction X (or a first horizontal axis direction) and a second direction Y (or a second horizontal axis direction) of the transparent substrate 171. The plurality of touch electrodes TE1 to TEn according to an embodiment may include a transparent conductive material, e.g. a transparent conductive oxide (TCO), e.g. indium tin oxide (ITO), indium zinc oxide (IZO), indium zinc tin oxide (IZTO), indium cesium oxide (ICO), or indium tungsten oxide (IWO). Here, the plurality of touch electrodes TE1 to TEn may each be formed of a crystalline transparent conductive material. For example, since the touch electrode part 170 according to the present embodiment is provided on the separate transparent substrate 171 without directly being deposited on the front surface of the thickness variation member 150, a thermal treatment process for lowering a resistance value of a transparent conductive material may be performed, and thus, the plurality of touch electrodes TE1 to TEn may each be formed of a crystalline transparent conductive material having a low resistance value.

Each of the plurality of touch electrodes TE1 to TEn according to an embodiment may overlap a certain number of pixels SP. That is, each of the plurality of touch electrodes TE1 to TEn may have a size corresponding to a size of the certain number of pixels SP. For example, one touch electrode TE may have a size corresponding to forty unit pixels in the first direction X parallel to a lengthwise direction of the gate lines and twelve unit pixels in the second direction Y parallel to a lengthwise direction of the data lines. In this case, one touch electrode TE may have a size corresponding to a size of 480 unit pixels. However, the present embodiment is not limited thereto, and a size of the touch electrode TE may be changed based on a touch resolution and a size (or a resolution) of an organic light emitting display panel. Also, the plurality of touch electrodes TE1 to TEn may be arranged in a lattice type, and in this case, the plurality of touch electrodes TE1 to TEn may not have the same size, a size of each of touch electrodes arranged in an edge of the touch electrode part 170 may be less than that of each of touch electrodes arranged in a center of the touch electrode part 170. In this case, a touch sensitivity between the center and the edge of the touch electrode part 170 is uniform.

The insulation layer 173 may be provided to cover a whole front surface of the transparent substrate 171 including the plurality of touch electrodes TE1 to TEn.

The plurality of touch routing lines RL may be respectively connected to the plurality of touch electrodes TE1 to TEn in a one-to-one relationship and may connect the plurality of touch routing lines RL to the touch pad part 175.

The plurality of touch routing lines RL according to an embodiment may be provided on the insulation layer 173 to overlap at least one touch electrode TE disposed in the second direction Y and may be respectively connected to, through a line contact hole LCH, the plurality of touch electrodes TE1 to TEn arranged in the second direction Y in a one-to-one relationship. One end of each of the plurality of touch routing lines RL may be electrically connected to a corresponding touch electrode TE, and the other end of each of the plurality of touch routing lines RL may be electrically connected to the touch pad part 175.

The touch pad part 175 may include a plurality of touch pad electrodes arranged in one edge of the transparent substrate 171. The plurality of touch pad electrodes may be respectively connected to the other ends of the plurality of touch routing lines RL in a one-to-one relationship.

Optionally, the plurality of touch routing lines RL according to an embodiment may be provided on the transparent substrate 171 and may be arranged on the same layer as the touch electrode TE. For example, the plurality of touch routing lines RL may be provided on the transparent substrate 171 to be adjacent to the touch electrodes TE with respect to the first direction X and may be respectively connected to the plurality of touch electrodes TE1 to TEn in a one-to-one relationship. That is, the plurality of touch routing lines RL may be patterned simultaneously with the plurality of touch electrodes TE1 to TEn, and thus, may be provided on the same layer as the plurality of touch electrodes TE1 to TEn on the transparent substrate 171. In this case, the insulation layer 173 may be provided to cover the front surface of the transparent substrate 171 including the plurality of touch electrodes TE1 to TEn and the plurality of touch routing lines RL, or may be omitted. The line contact hole LCH may be omitted.

Figure 6:
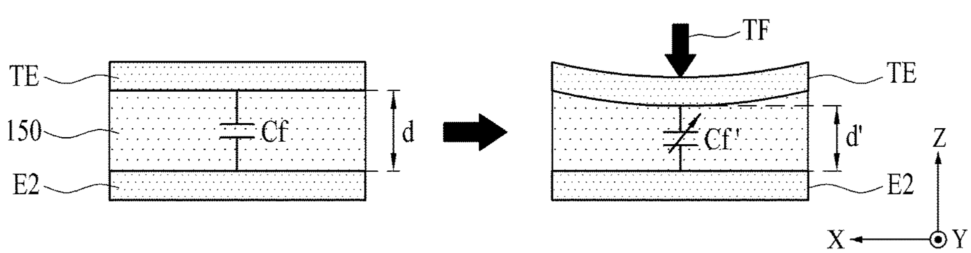
FIG. 6 is a diagram for describing a capacitance variation between a second electrode and a touch electrode caused by a touch force.

The organic light emitting display device 100 according to an embodiment may include the light emitting device layer EDL, and the first and second electrodes E1 and E2 provided on the substrate 110, wherein the light emitting device layer EDL is disposed between the first electrode E1 and the second electrode E2, and the touch electrode part 170 is provided on the second electrode E2. A distance between the second electrode E2 and the touch electrode part 170 may vary according to a touch force applied to the touch electrode part 170. That is, as illustrated in FIG. 6, the organic light emitting display device 100 according to an embodiment may include the thickness variation member 150 having an elastic characteristic disposed between the second electrode E2 and the touch electrode part 170, and thus, a thickness d of the thickness variation member 150 may be changed according to the touch force applied to the touch electrode part 170. Based on the thickness d of the thickness variation member 150, in the present embodiment, a variation of the force capacitance Cf generated between the second electrode E2 of the organic light emitting display panel and the touch electrode TE of the touch electrode part 170 may be sensed, thereby sensing a user touch force.

In detail, the second electrode E2 of the organic light emitting display panel and the touch electrode TE of the touch electrode part 170 may each be formed of a conductive material, and the thickness variation member 150 having a dielectric constant may be disposed therebetween. Accordingly, the second electrode E2, the thickness variation member 150, and the touch electrode TE overlapping each other may be defined as the force capacitance Cf in circuit.

The force capacitance Cf may increase as a distance d between the second electrode E2 and the touch electrode TE decreases to a distance d', as illustrated in FIG. 6. That is, generally, since the force capacitance Cf is inversely proportional to a distance between two electrodes, as the touch electrode TE which is bent according to a touch force TF (or a touch pressure) gets closer to the second electrode E2, a distance d between the second electrode E2 and the touch electrode TE may decrease to a distance d', and thus, the force capacitance Cf may increase to a force capacitance Cf', as illustrated in FIG. 6. Therefore, in order to enhance a sensing sensitivity of a force touch, a separation distance d between the second electrode E2 and the touch electrode TE may be set to at least 500 μm or more in a state where the touch force TF is not applied. Here, in a case where the separation distance d between the second electrode E2 and the touch electrode TE is less than 500 μm, since a variation of the force capacitance Cf is very small in comparison with a level variation of the touch force TF, the variation of the force capacitance Cf may be very slight in comparison with the touch force TF which is relatively strong, and for this reason, it is difficult to differentiate the touch force TF, causing a reduction in a sensing sensitivity of the force touch.

Referring again to FIGS. 1 to 3, the cover window 300 may be attached on a front surface of the organic light emitting display device 100 and may be supported by the housing 500. In this case, the cover window 300 may be movably supported by the housing 500 so as to be concavely modified toward the housing 500 by a user touch. In other words, a user touch may deform the cover window 300 so that the cover window 300 assumes a concave shape.

The cover window 300 according to an embodiment may be attached on the front surface of the organic light emitting display device 100 (in more detail, the front surface of the touch electrode part 170), e.g. by using a third transparent adhesive member 310, thereby supporting the organic light emitting display device 100 and protecting the organic light emitting display device 100 from an external impact. Here, the third transparent adhesive member 310 may be an OCA, an OCR, or the like.

The cover window 300 according to an embodiment may be formed of tempered glass, transparent plastic, a transparent film, or the like. The cover window 300 may include tempered glass, based on scratch and transparency. For example, the cover window 300 may include at least one of sapphire glass and gorilla glass.

Optionally, the cover window 300 may be disposed to cover the whole front surface of the organic light emitting display device 100 and supported to the housing 500 without being attached on the organic light emitting display device 100, thereby protecting the organic light emitting display device 100 from an external impact. Accordingly, an air gap between the cover window 300 and the organic light emitting display device 100 may be provided. In this case, when the cover window 300 is damaged by an external impact, the damage of the touch electrode part 170 caused by the damage of the cover window 300 is minimized.

The housing 500 may accommodate the organic light emitting display device 100 and may support the cover window 300. That is, the housing 500 may surround a rear surface and each of side surfaces of the organic light emitting display device 100 attached on the cover window 300.

The housing 500 according to an embodiment may include an accommodation space defined by a housing plate 510 and a housing side wall 530 and may have a box shape with a front surface opened. The housing 500 may include a metal material or a plastic material. For example, the housing 500 may include aluminum (Al), invar (FeNi36), magnesium (Mg), and/or the like.

The housing plate 510 may be a floor of the accommodation space. The housing plate 510 may support the organic light emitting display device 100 and may cover a rear surface of the organic light emitting display device 100.

A rear surface of the housing plate 510 may be used as a system accommodating space **510*s*. The system accommodating space 510*s* may accommodate the driving circuit unit 700, a battery supplying a driving power, a communication module, a power source circuit, a security module, a speaker module, a camera module, a memory, and/or the like. The system accommodating space 510*s* may be covered by a rear cover 550. The rear cover 550 may be coupled to a rear surface of the housing 500 so as to be opened or closed, for replacing the battery, but is not limited thereto. In a case where an electronic device uses an internal battery, the rear cover 550 may be coupled to the rear surface of the housing 500** so as not to be opened or closed by a user.

The housing side wall 530 may be provided vertical to each of side surfaces of the housing plate 510. The housing side wall 530 may support the cover window 300, and thus, may surround each side surface of the organic light emitting display device 100 hung on the cover window 300 and each of side surfaces of the cover window 300.

Optionally, the housing side wall 530 may include a groove 531 provided in an upper inner surface with respect to the height direction Z (or the vertical axis direction), and an elastic member 570 may be installed in the groove 531. The elastic member 570 may be attached on the groove 531 and may be disposed between a rear edge of the cover window 300 and the housing side wall 530, and thus, may absorb an external impact applied to the cover window 300, thereby allowing the cover window 300 to be smoothly bent by a user touch force. The elastic member 570 according to an embodiment may include an elastic pad, a double-sided adhesive foam pad, a spring, or the like having an elastic restoring force.

The driving circuit unit 700 may allow the organic light emitting display device 100 to display an image and may sense a touch position and a touch force based on a user touch through the organic light emitting display device 100 to execute an application program corresponding to the touch position and/or the touch force.

The driving circuit unit 700 according to an embodiment may include a circuit board 710, a first flexible printed circuit cable 720, a second flexible printed circuit cable 730, a display panel driving circuit 740, a touch driving circuit 750, a touch control circuit 760, and a system controller 770.

The circuit board 710 may be accommodated in the system accommodation space 510*s* of the housing 500 and may support the touch control circuit 760 and the system controller 770.

The first flexible printed circuit cable 720 may be connected to a first connector provided in the circuit board 710 and may be connected to the panel pad part 115 provided on the substrate 110 of the organic light emitting display device 100.

The second flexible printed circuit cable 730 may be connected to a second connector provided in the circuit board 710 and may be connected to the touch pad part 175 provided in the touch electrode part 170 of the organic light emitting display device 100.

The display panel driving circuit 740 may be an element for displaying an image on the organic light emitting display device 100 and may be a driving integrated circuit (IC) mounted in a chip mounting area in a chip-on glass (COG) type. The display panel driving circuit 740 may be connected to the panel pad part 115 provided on the substrate 110, respectively connected to the plurality of data lines in a one-to-one relationship, and connected to the scan driving circuit. The display panel driving circuit 740 may receive digital video data, a timing synch signal, a driving power, and a cathode power supplied from the system controller 770 through the first flexible printed circuit cable 720 and the panel pad part 115. For example, the display panel driving circuit 740 may align the digital video data into pixel-based pixel data so as to match an arrangement structure of the plurality of pixels SP provided in the organic light emitting display device 100 according to the timing synch signal, convert the pixel-based pixel data into a pixel-based data signal to supply the data signal to a corresponding pixel through a corresponding data line, and supply the cathode power to the second electrode E2 connected to each of the pixels SP in common. Simultaneously, the display panel driving circuit 740 may generate a scan control signal and may supply the scan control signal to the scan driving circuit according to the timing synch signal.

Optionally, the display panel driving circuit 740 may be mounted on the first flexible printed circuit cable 720. In this case, the display panel driving circuit 740 may receive the digital video data, the timing synch signal, the driving power, and the cathode power supplied from the system controller 770 through the first flexible printed circuit cable 720, supply the pixel-based data signal to a corresponding data line through the panel pad part 115, supply the cathode power to the second electrode E2, and supply the scan control signal to the scan driving circuit.

The touch driving circuit 750 may be mounted on the second flexible printed circuit cable 730, connected to the touch control circuit 760 mounted on the circuit board 710 through the second flexible printed circuit cable 730, and connected to each of the plurality of touch electrodes TE1 to TEn through the second flexible printed circuit cable 730, the touch pad part 175, and the plurality of touch routing lines RL in a one-to-one relationship. The touch driving circuit 750 may sense a capacitance variation of each of the plurality of touch electrodes TE1 to TEn caused by a user touch to generate an electrode-based sensing signal, based on a capacitive touch sensing method, analog-digital convert the generated electrode-based sensing signal to generate electrode-based sensing raw data, and supply the electrode-based sensing raw data to the system controller 770.

Figure 7:
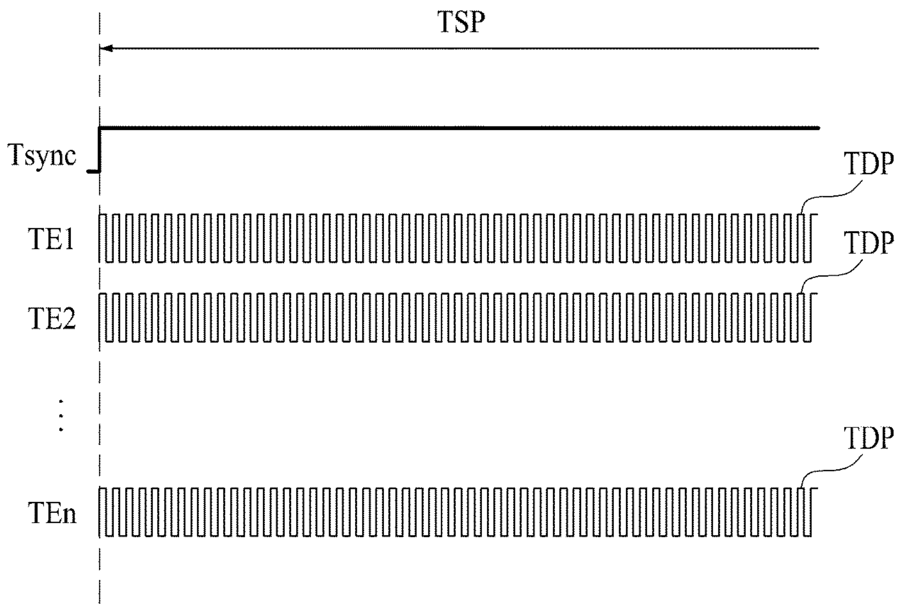
FIGS. 7 and 8 are waveform diagrams showing a driving method of the touch electrode part illustrated in FIG. 5.

The touch driving circuit 750 according to an embodiment, as shown in FIG. 7, may receive a touch synch signal Tsync supplied from the touch control circuit 760, generate a touch driving pulse TDP to simultaneously supply the touch driving pulse TDP to the plurality of touch electrodes TE1 to TEn through the plurality of touch routing lines RL during a touch sensing period TSP based on the touch synch signal Tsync, sequentially or simultaneously sense capacitance variations of the plurality of touch electrodes TE1 to TEn through the plurality of touch routing lines RL to generate electrode-based sensing raw data, and supply the electrode-based sensing raw data to the touch control circuit 760. Here, in the present embodiment, by simultaneously supplying the touch driving pulse TDP to the plurality of touch electrodes TE1 to TEn, the touch driving circuit 750 may remove a parasitic capacitance between each of the plurality of touch electrodes TE1 to TEn and one corresponding touch routing line of the plurality of touch routing lines RL, thereby enhancing a sensing sensitivity.

Figure 8:
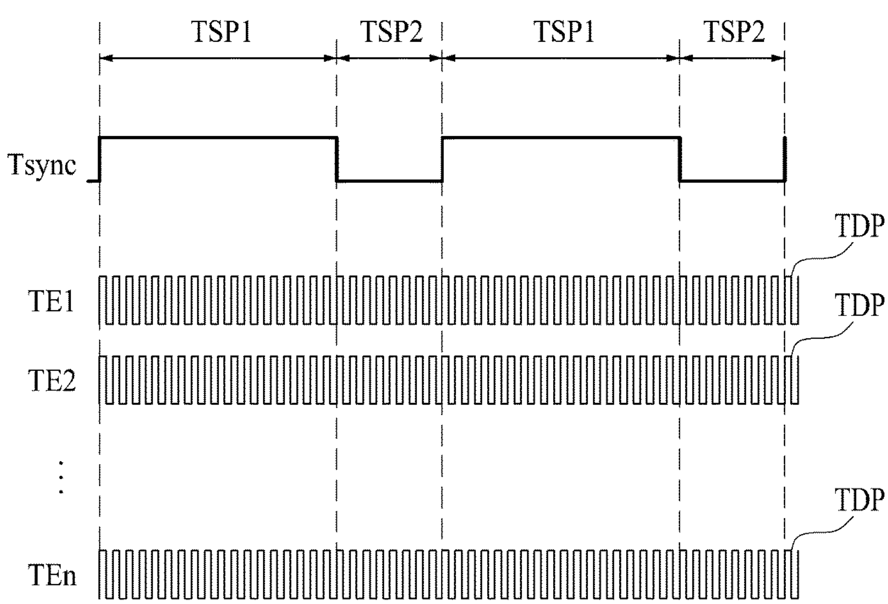

The touch driving circuit 750 according to an embodiment, as shown in FIG. 8, may receive the touch synch signal Tsync having first and second touch sensing periods TSP1 and TSP2 from the touch control circuit 760. The touch driving circuit 750 may generate the touch driving pulse TDP to simultaneously supply the touch driving pulse TDP to the plurality of touch electrodes TE1 to TEn through the plurality of touch routing lines RL during the first touch sensing period TSP1 based on the touch synch signal Tsync, sequentially or simultaneously sense capacitance variations of the plurality of touch electrodes TE1 to TEn through the plurality of touch routing lines RL to generate electrode-based sensing raw data, and supply the electrode-based sensing raw data to the touch control circuit 760. Subsequently, the touch driving circuit 750 may generate the touch driving pulse TDP to simultaneously supply the touch driving pulse TDP to the plurality of touch electrodes TE1 to TEn through the plurality of touch routing lines RL during the second touch sensing period TSP2 based on the touch synch signal Tsync, sequentially or simultaneously sense capacitance variations of the plurality of touch electrodes TE1 to TEn through the plurality of touch routing lines RL to generate electrode-based sensing raw data, and supply the electrode-based sensing raw data to the touch control circuit 760.

Figure 9A:
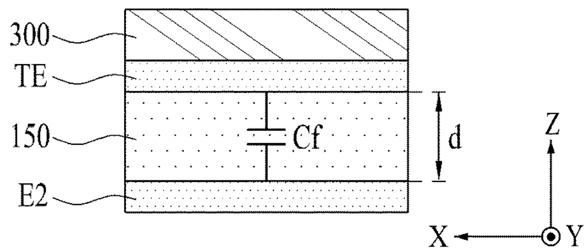
FIGS. 9A to 9C are diagrams showing a capacitance generated based on a user touch, in an embodiment of the present disclosure.
Figure 9B:
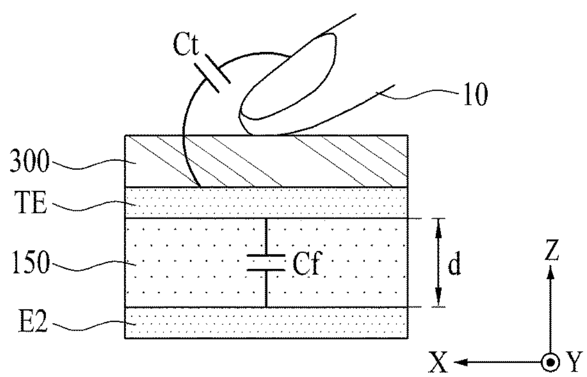
Figure 9C:
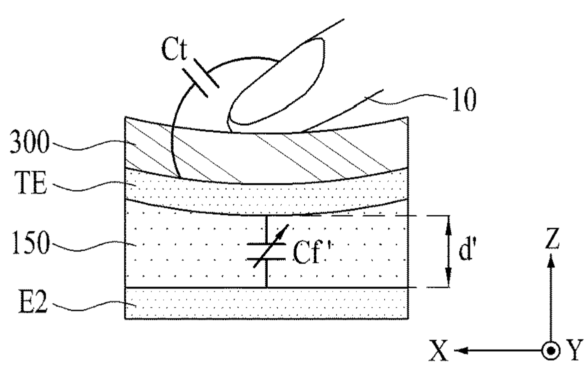

A capacitance of each of the plurality of touch electrodes TE1 to TEn, as illustrated in FIGS. 9A and 9B, may further vary by a touch capacitance Ct generated between the touch electrode TE and a user finger 10 when a user touch is performed, in addition to a variation of a force capacitance Cf between the second electrode E2 of the pixel array layer 120 and the touch electrode TE caused by a user touch force. That is, in a general capacitance-type touch sensing, the capacitance of each of the plurality of touch electrodes TE1 to TEn may increase by only a touch capacitance Ct generated between the touch electrode TE and the user finger 10 when the user touch is performed. However, in the present embodiment, the force capacitance Cf may be additionally generated between the touch electrode TE and the second electrode E2 due to the thickness variation member 150 disposed between the touch electrode TE and the second electrode E2 of the pixel array layer 120, and the force capacitance Cf may increase to Cf' as a distance d between the touch electrode TE and the second electrode E2 is reduced to d', as is illustrated in FIG. 9C. Therefore, a capacitance Cf of the touch electrode TE based on a user touch may increase by the touch capacitance Ct, and simultaneously, may further increase by the force capacitance change ΔC=Cf'−Cf corresponding to a distance change Δd=d'−d between the touch electrode TE and the second electrode E2, as illustrated in FIG. 9C. That is, a capacitor Ct having the touch capacitance Ct and a capacitor Cf having the force capacitance Cf may have a parallel connection structure in circuit, and when the user touch is performed, the capacitance of the touch electrode TE may become a sum "Cf+Ct" of the touch capacitance Ct and the force capacitance Cf, and may become a sum "Cf'+Ct'" (where Cf'>Cf) when the distance between the touch electrode TE and the second electrode E2 changes from d to d' (where d'<d).

Figure 10:
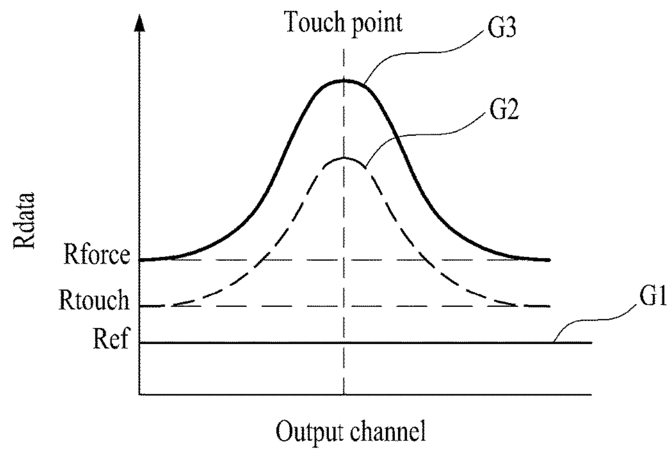
FIG. 10 is a graph for describing sensing raw data corresponding to touch electrodes provided in a touch area when a user touch illustrated in FIGS. 9A to 9C is performed.

For example, when the touch electrode TE is not touched as illustrated in FIG. 9A, as in a first graph G1 of FIG. 10, the touch driving circuit 750 may generate sensing raw data Rdata having a reference value Ref corresponding to a force capacitance Cf based on a reference distance d between the touch electrode TE and the second electrode E2.

For example, when a user does not intentionally apply pressure and thus the touch electrode TE is simple-touched by less than reference pressure as illustrated in FIG. 9B, as in a second graph G2 of FIG. 10, for touch electrodes provided in a touch area, the touch driving circuit 750 may generate sensing raw data Rdata having a touch reference value Rtouch or more corresponding to a sum "Cf+Ct" of a force capacitance Cf based on a reference distance d between the touch electrode TE and the second electrode E2 and a touch capacitance Ct between the touch electrode TE and a user finger.

For example, when the user intentionally applies pressure and thus the touch electrode TE is force-touched by reference pressure or more as illustrated in FIG. 9C, as in a third graph G3 of FIG. 10, for touch electrodes provided in a touch area, the touch driving circuit 750 may generate sensing raw data Rdata having a force reference value Rforce or more corresponding to a sum "Cf'+Ct" of an increase amount of a force capacitance Cf' based on a distance change d' between the touch electrode TE and the second electrode E2 and a touch capacitance Ct between the touch electrode TE and a user finger.

Optionally, the touch driving circuit 750 may be mounted on the transparent substrate 171 of the touch electrode part 170 and may be connected to the touch control circuit 760 through the second flexible printed circuit cable 730.

The touch control circuit 760 may be mounted on the circuit board 710 and may be connected to the touch driving circuit 750 through the second flexible printed circuit cable 730.

The touch control circuit 760 according to an embodiment may generate the touch synch signal to control driving of the touch driving circuit 750. The touch control circuit 760 according to an embodiment may generate the touch synch signal having first and second touch sensing periods to control time-divisional driving of the touch driving circuit 750. The touch control circuit 760 may generate touch coordinate information (or two-dimensional (2D) touch information) and/or touch force level information (or three-dimensional (3D) touch information), based on the electrode-based sensing raw data supplied from the touch driving circuit 750 and may supply the touch coordinate information and/or the touch force level information to the system controller 770.

The touch control circuit 760 according to an embodiment may divide the electrode-based sensing raw data into touch raw data and force raw data and may generate the touch coordinate information based on the touch raw data and the touch force level information based on the force raw data. For example, the touch control circuit 760 may temporarily store each of the electrode-based sensing raw data Rdata as electrode-based touch raw data in the memory, subtract reference subtraction data from each of the electrode-based sensing raw data, and temporarily store raw data, obtained through the subtraction, as electrode-based force raw data in the memory. Subsequently, the touch control circuit 760 may calculate touch coordinate information based on a position of a touch electrode TE corresponding to a maximum value of touch raw data, exceeding a touch threshold value, of the electrode-based touch raw data and may temporarily store the touch coordinate information in the memory. Simultaneously, the touch control circuit 760 may calculate a maximum value of force raw data, exceeding a force threshold value, of the electrode-based force raw data as a touch force level and may temporarily store the touch force level in the memory. Subsequently, the touch control circuit 760 may supply the touch force level and the touch coordinate information, temporarily stored in the memory, to the system controller 770. Here, the reference subtraction data may be used to extract sensing raw data Rdata corresponding to a pure force touch by excluding sensing raw data, corresponding to a touch capacitance Ct which is generated when a user touch is performed, from the electrode-based sensing raw data and may have a value corresponding to sensing raw data corresponding to a touch capacitance Ct which is generated when a simple touch less than the reference pressure where the user does not intentionally apply pressure is performed.

The touch control circuit 760 according to an embodiment may calculate touch coordinate information based on a position of a touch electrode TE corresponding to a maximum value of touch raw data, exceeding the touch threshold value, of the electrode-based sensing raw data supplied from the touch driving circuit 750 during a first touch sensing period and may temporarily store the touch coordinate information in the memory. Also, during the second touch sensing period, the touch control circuit 760 may subtract the reference subtraction data from each of the electrode-based sensing raw data supplied from the touch driving circuit 750, temporarily store raw data obtained through the subtraction as electrode-based force raw data in the memory, calculate a maximum value of force raw data, exceeding the force threshold value, of the temporarily stored electrode-based force raw data as a touch force level, temporarily store the touch force level in the memory. Subsequently, the touch control circuit 760 may supply the touch force level and the touch coordinate information, temporarily stored in the memory, to the system controller 770.

Optionally, the touch control circuit 760 and the touch driving circuit 750 may be configured as one touch integrated circuit (IC), and in this case, the touch IC may be mounted on one of the transparent substrate 171 of the touch electrode part 170, the second flexible printed circuit cable 730, and the circuit board 710. Furthermore, the touch control circuit 760 may be built into the system controller 770.

The system controller 770, a micro controller unit (MCU), may be mounted on the circuit board 710 to control overall driving of the electronic device. That is, the system controller 770 may generate the timing synch signal and a data signal which is to be displayed as an image on the organic light emitting display device 100, based on a source image supplied from an image processing module and may supply the timing synch signal and the data signal to the display panel driving circuit 740. Also, the system controller 770 may execute an application program corresponding to 2D touch information and/or 3D touch information (i.e., a program shortcut icon) supplied from the touch control circuit 760. Here, the application program may include a touch position-based application program and a touch force-based application program which are installed in the electronic device.

As described above, the electronic device including the organic light emitting display device having the force touch function according to the present embodiment may include the first and second electrodes E1 and E2 and the light emitting device layer EDL provided on the substrate 110, with the light emitting device layer EDL disposed between the first electrode E1 and the second electrode E2, and the touch electrode part 170 provided on the second electrode E2. A distance d between the second electrode E2 and the touch electrode part 170 may be changed according to a touch force applied to the touch electrode part 170. Therefore, in the present embodiment, the touch driving circuit 750 may simultaneously sense a touch capacitance and a force capacitance by sensing a capacitance variation of the touch electrode part 170 caused by a distance change between the second electrode E2 and the touch electrode part 170 caused by a user touch to generate sensing raw data, and the touch control circuit 760 may divide the sensing raw data into touch raw data and force raw data to generate 2D touch information and/or 3D touch information. Therefore, in the present embodiment, the electrode E2 and the touch electrode TE of the touch electrode part 170 provided on the pixel array layer 120 of the organic light emitting display device 100 may be used as a force sensing electrode for sensing a touch force, and a touch may be sensed by using one touch driving circuit 750 sensing a touch position. Accordingly, the touch force may be sensed even without a separate force sensor and a separate force touch driving IC for sensing a touch force, thereby reducing a thickness of an electronic device, the number of elements, and the manufacturing cost.

Figure 11:
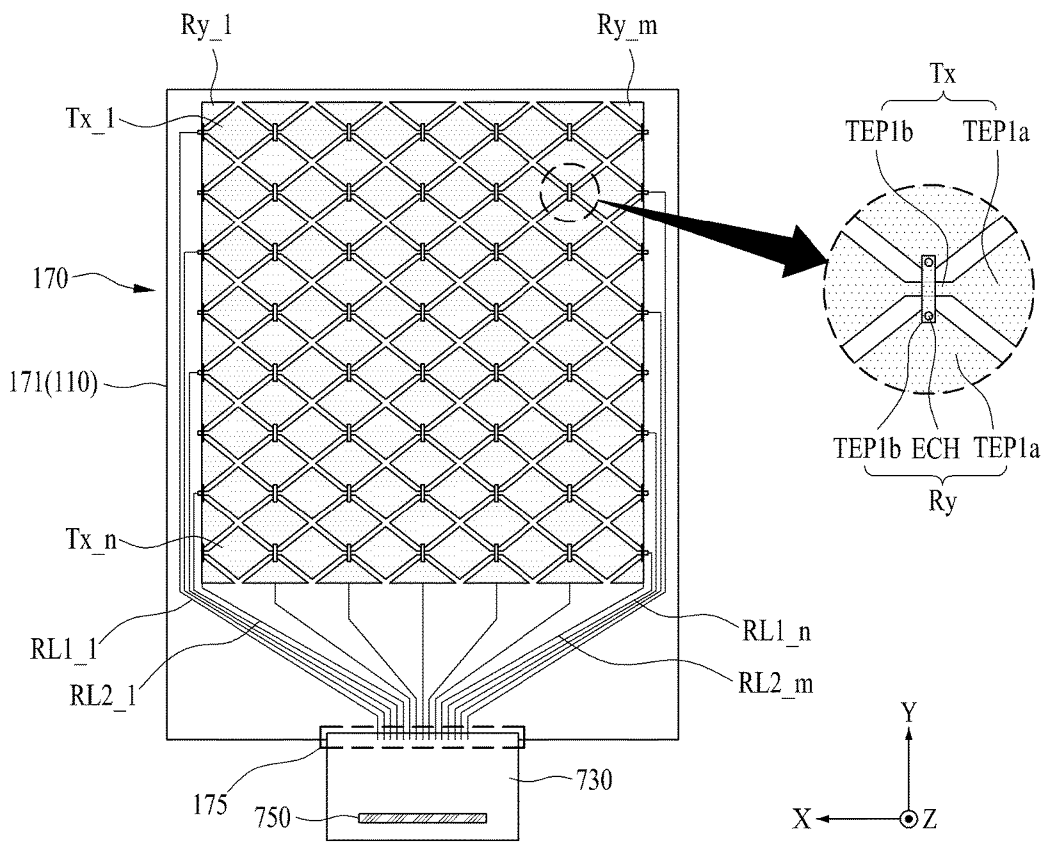
FIG. 11 is a plan view illustrating a touch electrode part according to an embodiment illustrated in FIG. 2.

FIG. 11 is a plan view illustrating the touch electrode part according to an embodiment illustrated in FIG. 2.

Referring to FIG. 11 along with FIGS. 2 and 3, the touch electrode part 170 according to an embodiment may include the transparent substrate 171, a plurality of first touch electrodes Tx_1 to Tx_n, a plurality of second touch electrodes Ry_1 to Ry_m, and the touch pad part 175.

The transparent substrate 171 may be attached on the front surface of the thickness variation member 150 by the second transparent adhesive member 160 and may be formed of the same material as that of the transparent substrate illustrated in FIG. 5.

Each of the plurality of first touch electrodes Tx_1 to Tx_n may be used as a force driving electrode or a touch driving electrode for sensing a user touch, or optionally, may be used as a force sensing electrode for sensing a user force touch.

Each of the plurality of first touch electrodes Tx_1 to Tx_n according to an embodiment may be provided on a front surface of the transparent substrate 171 and may be formed of a transparent conductive material. The plurality of first touch electrodes Tx_1 to Tx_n may be arranged at certain intervals along the second direction Y and may be arranged in parallel to the first direction X. Each of the plurality of first touch electrodes Tx_1 to Tx_n according to an embodiment may include a plurality of first touch electrode patterns TEP1*a* arranged at certain intervals along the first direction X and a plurality of electrode connection patterns TEP1*b* which electrically connect first touch electrode patterns TEP1*a* adjacent to each other in the first direction X. Here, each of the plurality of first touch electrode patterns TEP1*a* may have a rectangular shape, an octagonal shape, a circular shape, a lozenged shape, or the like, and each of the plurality of electrode connection patterns TEP1*b* may have a bar shape. The plurality of first touch electrodes Tx_1 to Tx_n may be connected to a plurality of first touch electrode pads, provided in the touch pad part 175, through a plurality of first touch routing lines RL1_1 to RL1_n provided in an edge of the transparent substrate 171 and may be connected to the touch driving circuit 750 through the plurality of first touch electrode pads.

Each of the plurality of second touch electrodes Ry_1 to Ry_m may be used as a force sensing electrode or a touch sensing electrode for sensing a user touch, or optionally, may be used as a force sensing electrode for sensing a user force touch.

Each of the plurality of second touch electrodes Ry_1 to Ry_m according to an embodiment may be provided on the front surface of the transparent substrate 171 and may be formed of a transparent conductive material. The plurality of second touch electrodes Ry_1 to Ry_m may be arranged at certain intervals along the first direction X and may be arranged in parallel to the second direction Y.

Each of the plurality of second touch electrodes Ry_1 to Ry_m according to an embodiment may include a plurality of second touch electrode patterns TEP2*a* arranged at certain intervals along the second direction Y of the transparent substrate 110 and a plurality of electrode bridge patterns TEP2*b* which electrically connect second touch electrode patterns TEP2*a* adjacent to each other in the second direction Y.

The plurality of second touch electrode patterns TEP2*a* may be provided on the front surface of the transparent substrate 110 between first touch electrode patterns TEP1*a* adjacent to each other along the second direction Y and may have the same shape as that of each of the first touch electrode patterns TEP1*a*. In this case, the electrode connection pattern TEP1*b* of each of the plurality of first touch electrodes Tx_1 to Tx_n may be provided between two adjacent second touch electrode patterns of the plurality of second touch electrode patterns TEP2*a* and may electrically separate two second touch electrode patterns TEP2*a* adjacent to each other along the second direction Y.

The plurality of electrode bridge patterns TEP2*b* may be provided on a layer different from the second touch electrode patterns TEP2*a* and may electrically connect two second touch electrode patterns TEP2*a* which are adjacent to each other with the electrode connection pattern TEP1*b* of the first touch electrodes Tx_1 to Tx_n therebetween along the second direction Y. In this case, each of the plurality of electrode bridge patterns TEP2*b* and the electrode connection patterns TEP1*b* of the first touch electrodes Tx_1 to Tx_n may be electrically separated from each other by a touch insulation layer. Here, the touch insulation layer may be provided all over the front surface of the transparent substrate 171 to cover the plurality of first touch electrodes Tx_1 to Tx_n and the plurality of second touch electrode patterns TEP2*a*.

Both edges of each of the plurality of electrode bridge patterns TEP2*b* may electrically connect two adjacent second touch electrode patterns TEP2*a* through an electrode contact hole ECH provided on the touch insulation layer to overlap edges of each of the two second touch electrode patterns TEP2*a* which are adjacent to each other with the electrode connection pattern TEP1*b* of the first touch electrodes Tx_1 to Tx_n therebetween along the second direction Y. Therefore, the two second touch electrode patterns TEP2*a* which are adjacent to each other with the electrode connection pattern TEP1*b* of the first touch electrodes Tx_1 to Tx_n therebetween along the second direction may be electrically connected to each other by a plurality of electrode bridge patterns TEP2*b* to configure one second touch electrode TE2. The plurality of electrode bridge patterns TEP2*b* according to an embodiment may be formed of the same transparent conductive material as that of the touch electrode patterns TEP1*a* and TEP2*a*. The plurality of electrode bridge patterns TEP2*b* according to an embodiment may be formed of a metal material, e.g. a metal material, which is strong in corrosion resistance and acid resistance, such as aluminum (Al), titanium (Ti), copper (Cu), molybdenum (Mo), and/or the like. The plurality of second touch electrodes Ry_1 to Ry_m may be connected to a plurality of second touch electrode pads, provided in the touch pad part 175, through a plurality of second touch routing lines RL2_1 to RL2_m provided in the edge of the transparent substrate 171 and may be connected to the touch driving circuit 750 through the plurality of second touch electrode pads.

The plurality of first touch electrodes Tx_1 to Tx_n and the plurality of second touch electrodes Ry_1 to Ry_m may be disposed on the same layer to have a checkered shape.

Optionally, each of the plurality of second touch electrodes Ry_1 to Ry_m may be provided on a layer different from the plurality of first touch electrodes Tx_1 to Tx_n. That is, the touch electrode part 170 according to an embodiment may include the plurality of first touch electrodes Tx_1 to Tx_n provided on the transparent substrate 171, a touch insulation layer covers all of the plurality of first touch electrodes Tx_1 to Tx_n, and the plurality of second touch electrodes Ry_1 to Ry_m provided on the touch insulation layer. In this case, each of the plurality of second touch electrodes Ry_1 to Ry_m may have an electrode connection pattern, which is similar to or the same as the electrode connection pattern TEP1*b*, instead of the electrode bridge pattern TEP2*b* and may be provided to intersect each of the plurality of first touch electrodes Tx_1 to Tx_n. In this case, each of the plurality of first touch electrode patterns TEP1*a* and the plurality of second touch electrode patterns TEP2*a* may have a bar shape in addition to a rectangular shape, an octagonal shape, a circular shape, a lozenged shape, or the like. Each of the plurality of first touch electrode patterns TEP1*a* and the plurality of second touch electrode patterns TEP2*a* having a bar shape may have a stripe shape which long extends without an electrode connection pattern.

Figure 12:
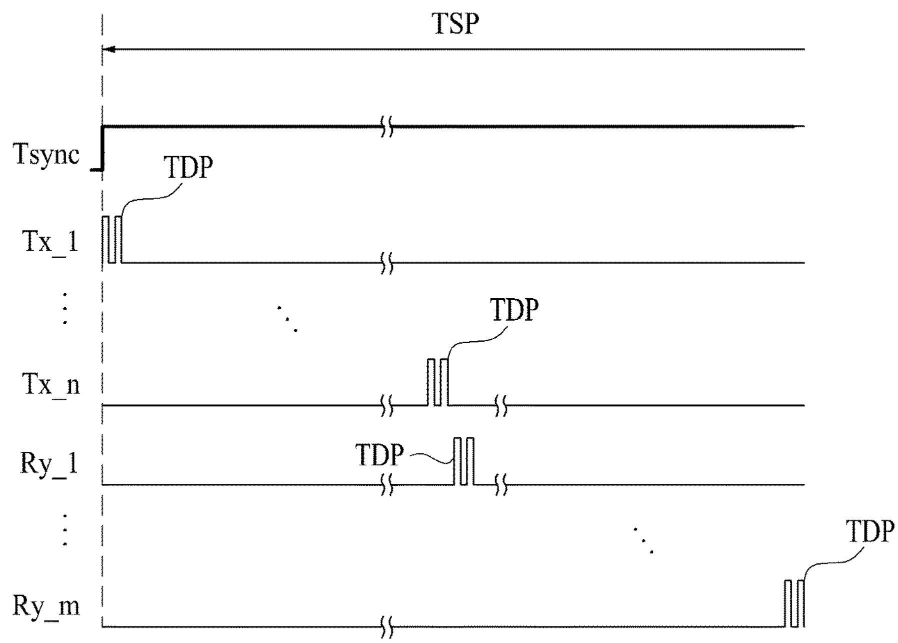
FIGS. 12 to 15 are waveform diagrams showing a driving method of the touch electrode part illustrated in FIG. 11.

FIG. 12 is a waveform diagram showing a driving method of the touch electrode part illustrated in FIG. 11.

Referring to FIGS. 11 and 12, the touch driving circuit 750 according to an embodiment may drive the touch electrode part 170 according to a self-capacitive touch sensing method to simultaneously sense a touch force and a touch position based on a user touch, thereby increasing a sensing sensitivity of the touch force.

For example, the touch driving circuit 750 according to an embodiment may receive the touch synch signal Tsync supplied from the touch control circuit 760, generate the touch driving pulse TDP during the touch sensing period TSP based on the touch synch signal Tsync, and sequentially supply the touch driving pulse TDP to the plurality of first touch electrodes Tx_1 to Tx_n through the plurality of first touch routing lines RL1_1 to RL1_n and then sequentially supply the touch driving pulse TDP to the plurality of second touch electrodes Ry_1 to Ry_m through the plurality of second touch routing lines RL2_1 to RL2_m. At this time, immediately after the touch driving pulse TDP is supplied, the touch driving circuit 750 may individually sense capacitance variations of corresponding touch electrodes Tx and Ry through corresponding touch routing lines RL1 and RL2 to generate electrode-based sensing raw data and may supply the electrode-based sensing raw data to the touch control circuit 760.

Therefore, as described above, the touch control circuit 760 may divide the electrode-based sensing raw data into touch raw data and force raw data and may generate touch coordinate information based on the touch raw data and touch force level information based on the force raw data to supply the touch coordinate information and touch force level information to the system controller 770. Thus, a repetitive description is omitted.

Figure 13:
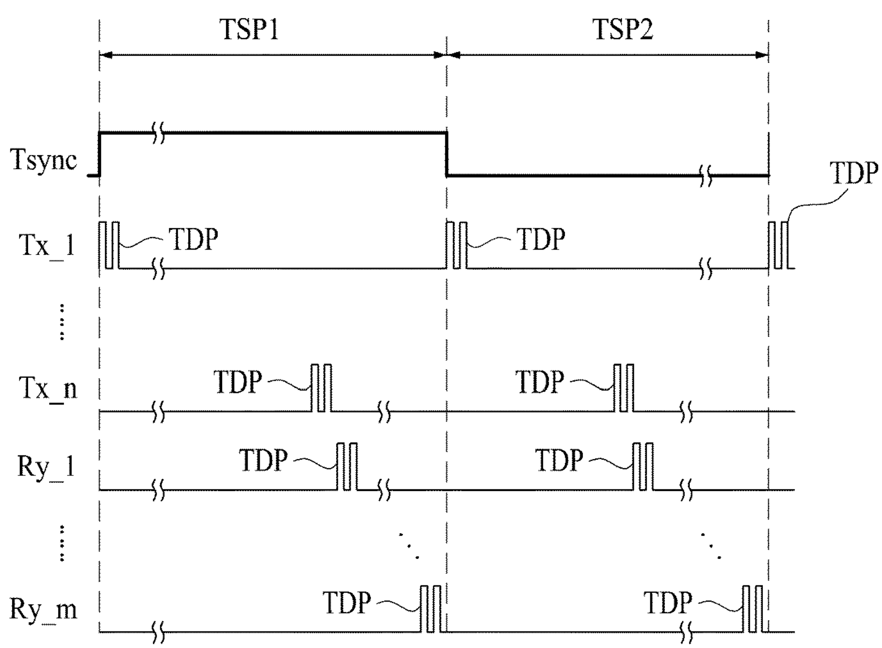

FIG. 13 is a waveform diagram showing a driving method of the touch electrode part illustrated in FIG. 11.

Referring to FIGS. 11 and 13, the touch driving circuit 750 according to an embodiment may time-divisionally drive the touch electrode part 170 according to a self-capacitive touch sensing method to time-divide and sense a touch force and a touch position based on a user touch, thereby reducing an operational time for each of the touch position and the touch force.

For example, the touch driving circuit 750 according to an embodiment may receive the touch synch signal Tsync having first and second touch sensing periods TSP1 and TSP2 from the touch control circuit 760.

During the first touch sensing period TSP1 based on the touch synch signal Tsync, the touch driving circuit 750 may generate the touch driving pulse TDP and may sequentially supply the touch driving pulse TDP to the plurality of first touch electrodes Tx_1 to Tx_n through the plurality of first touch routing lines RL1_1 to RL1_n and then sequentially supply the touch driving pulse TDP to the plurality of second touch electrodes Ry_1 to Ry_m through the plurality of second touch routing lines RL2_1 to RL2_m. At this time, immediately after the touch driving pulse TDP is supplied, the touch driving circuit 750 may individually sense capacitance variations of corresponding touch electrodes Tx and Ry through corresponding touch routing lines RL1 and RL2 to generate electrode-based sensing raw data and may supply the electrode-based sensing raw data to the touch control circuit 760.

Subsequently, during the second touch sensing period TSP2 based on the touch synch signal Tsync, the touch driving circuit 750 may generate the touch driving pulse TDP and may sequentially supply the touch driving pulse TDP to the plurality of first touch electrodes Tx_1 to Tx_n through the plurality of first touch routing lines RL1_1 to RL1_n and then sequentially supply the touch driving pulse TDP to the plurality of second touch electrodes Ry_1 to Ry_m through the plurality of second touch routing lines RL2_1 to RL2_m. At this time, immediately after the touch driving pulse TDP is supplied, the touch driving circuit 750 may individually sense capacitance variations of the corresponding touch electrodes Tx and Ry through the corresponding touch routing lines RL1 and RL2 to generate electrode-based sensing raw data and may supply the electrode-based sensing raw data to the touch control circuit 760.

Therefore, as described above, the touch control circuit 760 may calculate touch coordinate information based on a position of a touch electrode TE corresponding to a maximum value of touch raw data, exceeding the touch threshold value, of the electrode-based sensing raw data supplied from the touch driving circuit 750 during the first touch sensing period and may temporarily store the touch coordinate information in the memory. Also, during the second touch sensing period, the touch control circuit 760 may subtract the reference subtraction data from each of the electrode-based sensing raw data supplied from the touch driving circuit 750, temporarily store raw data obtained through the subtraction as electrode-based force raw data in the memory, calculate a maximum value of force raw data, exceeding the force threshold value, of the temporarily stored electrode-based force raw data as a touch force level, temporarily store the touch force level in the memory. Subsequently, the touch control circuit 760 may supply the touch force level and the touch coordinate information, temporarily stored in the memory, to the system controller 770.

Figure 14:
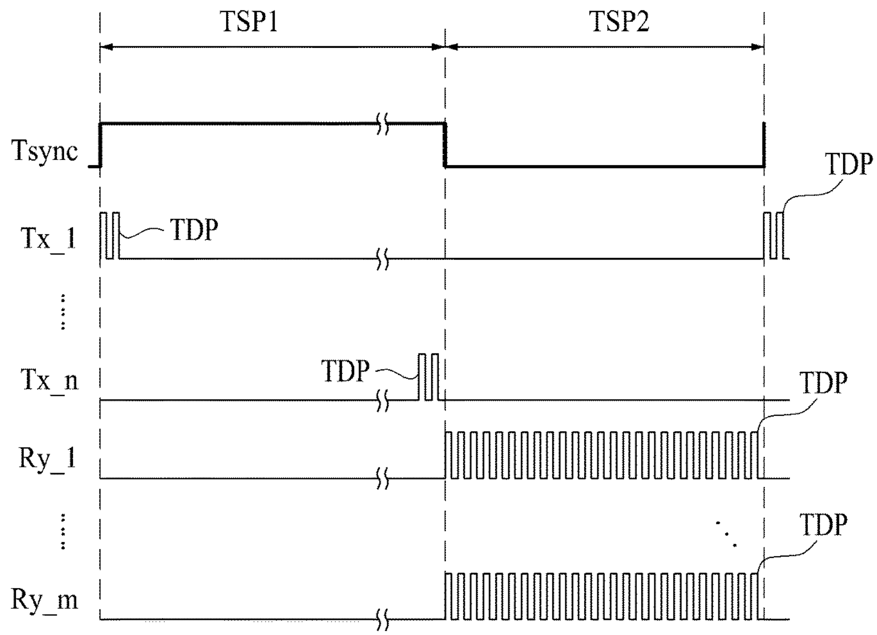

FIG. 14 is a waveform diagram showing a driving method of the touch electrode part illustrated in FIG. 11.

Referring to FIGS. 11 and 14, the touch driving circuit 750 according to an embodiment may time-divisionally drive the touch electrode part 170, sense a touch position based on a user touch according to a capacitive touch sensing method, and time-divide and sense a touch force according to a self-capacitive touch sensing method using only the plurality of second touch electrodes Ry_1 to Ry_m, thereby increasing a sensing sensitivity of the touch force.

For example, the touch driving circuit 750 according to an embodiment may receive the touch synch signal Tsync having the first and second touch sensing periods TSP1 and TSP2 from the touch control circuit 760.

During the first touch sensing period TSP1 based on the touch synch signal Tsync, the touch driving circuit 750 may generate the touch driving pulse TDP and may sequentially supply the touch driving pulse TDP to the plurality of first touch electrodes Tx_1 to Tx_n through the plurality of first touch routing lines RL1_1 to RL1_n. At this time, simultaneously with the touch driving pulse TDP being supplied, the touch driving circuit 750 may individually sense capacitance variations between corresponding first touch electrodes Tx_1 to Tx_n and second touch electrodes Ry_1 to Ry_m through the plurality of second touch routing lines RL2_1 to RL2_m to generate electrode-based sensing raw data and may supply the electrode-based sensing raw data to the touch control circuit 760.

Subsequently, during the second touch sensing period TSP2 based on the touch synch signal Tsync, the touch driving circuit 750 may generate the touch driving pulse TDP and may simultaneously supply the touch driving pulse TDP to the plurality of second touch electrodes Ry_1 to Ry_m through the plurality of second touch routing lines RL2_1 to RL2_m. At this time, immediately after the touch driving pulse TDP is supplied, the touch driving circuit 750 may sense a capacitance variation of a corresponding second touch electrodes Ry through a corresponding second touch routing line RL2 to individually generate sensing raw data of each of the plurality of second touch electrodes Ry_1 to Ry_m and may supply the sensing raw data to the touch control circuit 760.

Therefore, the touch control circuit 760 may calculate touch coordinate information based on a position of a touch electrode TE corresponding to a maximum value of touch raw data, exceeding the touch threshold value, of the sensing raw data of the plurality of second touch electrodes Ry_1 to Ry_m supplied from the touch driving circuit 750 during the first touch sensing period and may temporarily store the touch coordinate information in the memory. Also, during the second touch sensing period, the touch control circuit 760 may calculate a maximum value of touch raw data, exceeding a predetermined force threshold value, of the sensing raw data of the plurality of second touch electrodes Ry_1 to Ry_m supplied from the touch driving circuit 750 as a touch force level and may temporarily store the touch force level in the memory. Subsequently, the touch control circuit 760 may supply the touch force level and the touch coordinate information, temporarily stored in the memory, to the system controller 770.

Figure 15:
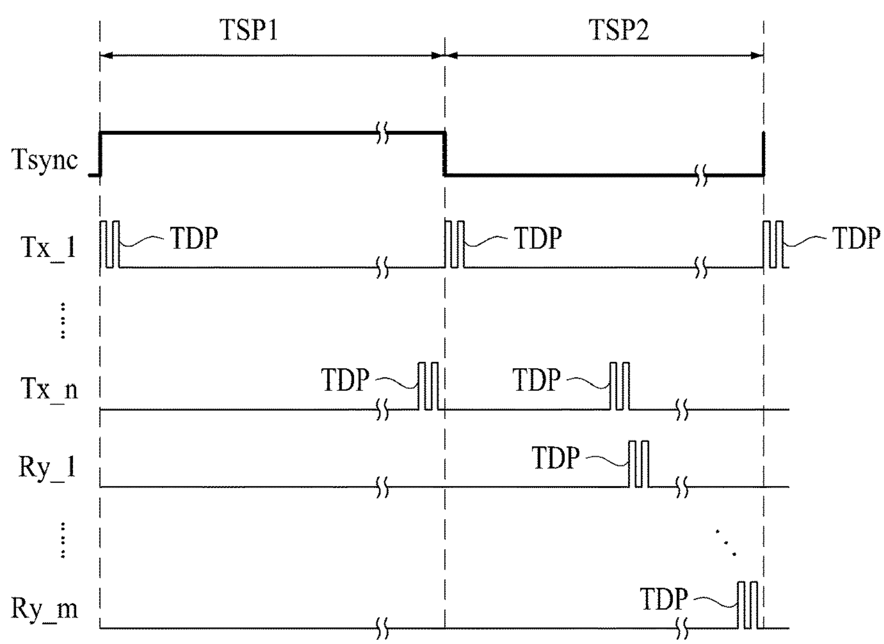

FIG. 15 is a waveform diagram showing a driving method of the touch electrode part illustrated in FIG. 11.

Referring to FIGS. 11 and 15, the touch driving circuit 750 according to an embodiment may time-divisionally drive the touch electrode part 170, sense a touch position based on a user touch according to a capacitive touch sensing method, and time-divide and sense a touch force according to a self-capacitive touch sensing method using only the plurality of first touch electrodes Tx_1 to Tx_n and the plurality of second touch electrodes Ry_1 to Ry_m, thereby increasing the sensing sensitivity and precision of the touch force.

For example, the touch driving circuit 750 according to an embodiment may receive the touch synch signal Tsync having the first and second touch sensing periods TSP1 and TSP2 from the touch control circuit 760.

During the first touch sensing period TSP1 based on the touch synch signal Tsync, the touch driving circuit 750 may generate the touch driving pulse TDP and may sequentially supply the touch driving pulse TDP to the plurality of first touch electrodes Tx_1 to Tx_n through the plurality of first touch routing lines RL1_1 to RL1_n. At this time, simultaneously with the touch driving pulse TDP being supplied, the touch driving circuit 750 may sense capacitance variations between corresponding first touch electrodes Tx_1 to Tx_n and second touch electrodes Ry_1 to Ry_m through the plurality of second touch routing lines RL2_1 to RL2_m to generate electrode-based sensing raw data and may supply the electrode-based sensing raw data to the touch control circuit 760.

Subsequently, during the second touch sensing period TSP2 based on the touch synch signal Tsync, the touch driving circuit 750 may generate the touch driving pulse TDP and may sequentially supply the touch driving pulse TDP to the plurality of first touch electrodes Tx_1 to Tx_n through the plurality of first touch routing lines RL1_1 to RL1_n and then sequentially supply the touch driving pulse TDP to the plurality of second touch electrodes Ry_1 to Ry_m through the plurality of second touch routing lines RL2_1 to RL2_m. At this time, immediately after the touch driving pulse TDP is supplied, the touch driving circuit 750 may individually sense capacitance variations of corresponding touch electrodes Tx and Ry through corresponding first touch electrodes Tx_1 to Tx_n and second touch routing lines RL2_1 to RL2_m to generate electrode-based sensing raw data and may supply the electrode-based sensing raw data to the touch control circuit 760.

Therefore, the touch control circuit 760 may calculate touch coordinate information based on a position of a touch electrode TE corresponding to a maximum value of touch raw data, exceeding the predetermined touch threshold value, of the sensing raw data of the plurality of second touch electrodes Ry_1 to Ry_m supplied from the touch driving circuit 750 during the first touch sensing period and may temporarily store the touch coordinate information in the memory. Also, during the second touch sensing period, the touch control circuit 760 may subtract the reference subtraction data from each of the electrode-based sensing raw data supplied from the touch driving circuit 750, temporarily store raw data obtained through the subtraction as electrode-based force raw data in the memory, calculate a maximum value of force raw data, exceeding the force threshold value, of the temporarily stored electrode-based force raw data as a touch force level, temporarily store the touch force level in the memory. Subsequently, the touch control circuit 760 may supply the touch force level and the touch coordinate information, temporarily stored in the memory, to the system controller 770.

Figure 16:
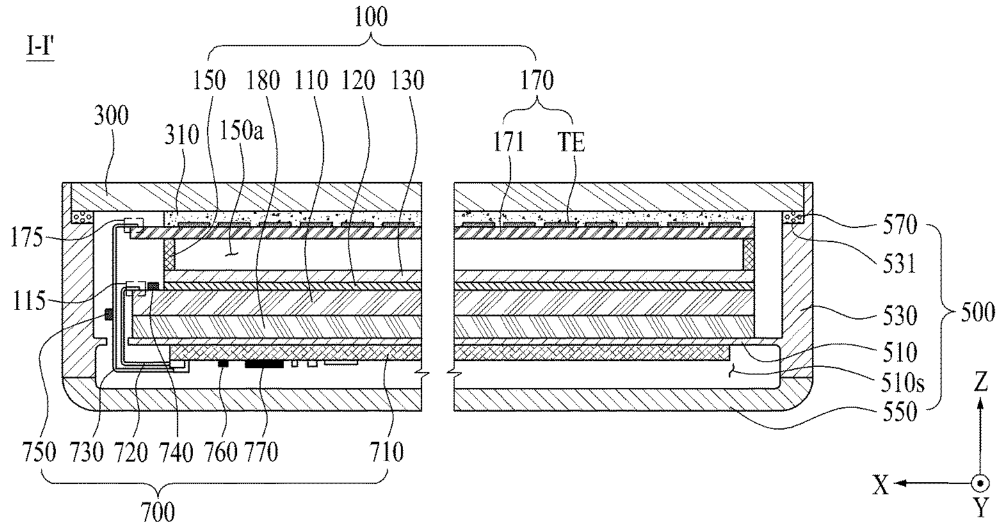
FIG. 16 is a cross-sectional view taken along line I-I' illustrated in FIG. 1.

FIG. 16 is a cross-sectional view taken along line I-I' illustrated in FIG. 1 and illustrates an example which is configured by modifying a thickness variation member of an organic light emitting display device in the electronic device illustrated in FIGS. 1 to 15. Hereinafter, therefore, a thickness variation member and elements relevant thereto will be described.

Referring to FIG. 16, the thickness variation member 150 of the organic light emitting display device 100 according to the present embodiment may be provided vertical to an edge of the encapsulation layer 130 and may support the touch electrode part 170 so as to be movable in the thickness direction Z of the organic light emitting display device 100. The thickness variation member 150 may separate the touch electrode part 170 from a front surface of the encapsulation layer 130 by a certain distance, and thus, an air layer 150*a* may be provided between the touch electrode part 170 and the encapsulation layer 130. The air layer 150*a* may provide a space which enables the touch electrode part 170 to be concavely bent toward the encapsulation layer 130 when a user touch is performed.

The thickness variation member 150 according to an embodiment may be an elastic supporting member including an elastic pad, a double-sided adhesive foam pad, a spring, or the like. The thickness variation member 150 may be formed of a porous material in order for the air layer 150*a* not to be sealed, and thus, enables the touch electrode part 170, bent by a user touch, to smoothly restore to an original position.

In the present embodiment, the touch electrode part 170 and the encapsulation layer 130 may be separated from each other with the air layer 150*a* therebetween by the thickness variation member 150, and thus, the first and second transparent adhesive members 140 and 160 of the organic light emitting display device 100 illustrated in FIGS. 1 to 15 may be omitted.

In the present embodiment, the air layer 150*a* may be provided between the touch electrode part 170 and the encapsulation layer 130 by the thickness variation member 150. The touch driving circuit 750 may simultaneously sense a force capacitance variation caused by a distance change between the second electrode E2 and the touch electrode part 170 caused by a user touch and a touch capacitance variation between the touch electrode part 170 and a user finger to generate sensing raw data, and the touch control circuit 760 may divide the sensing raw data into touch raw data and force raw data to generate 2D touch information and/or 3D touch information. Accordingly, in the present embodiment, the same effects as those of the electronic device illustrated in FIGS. 1 to 15 are provided.

Figure 17:
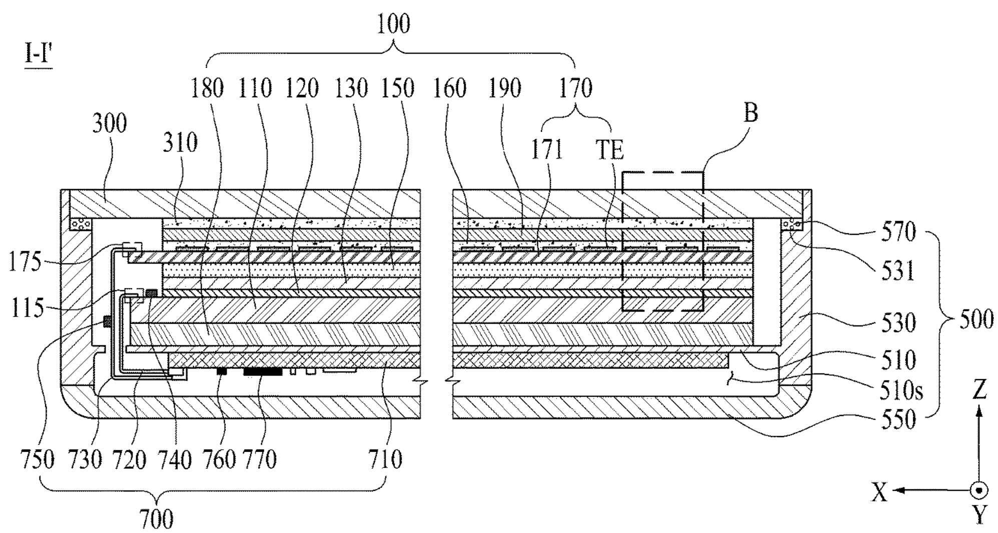
FIG. 17 is a cross-sectional view taken along line I-I' illustrated in FIG. 1.
Figure 18:
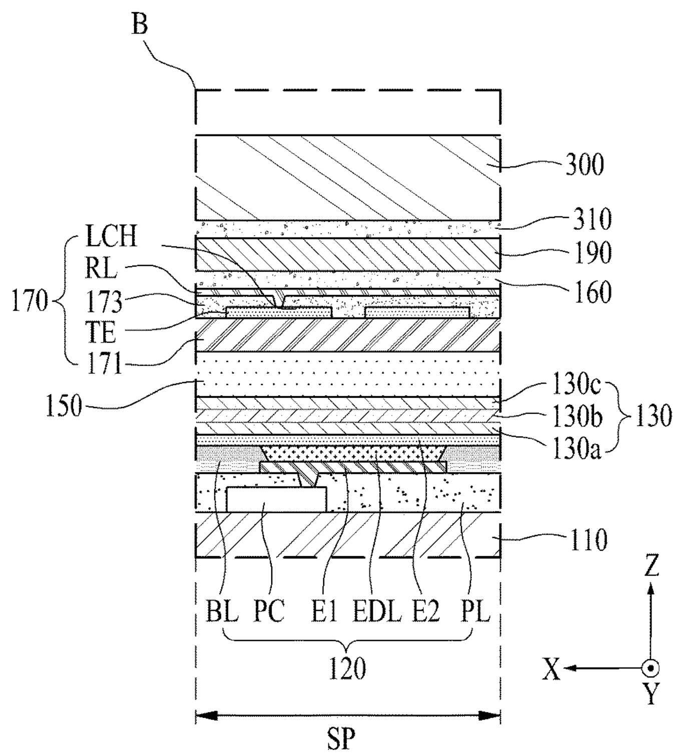
FIG. 18 is an enlarged view of portion B illustrated in FIG. 17.

FIG. 17 is a cross-sectional view taken along line I-I' illustrated in FIG. 1, and FIG. 18 is an enlarged view of portion B illustrated in FIG. 17. FIGS. 17 and 18 illustrate an example where in the electronic device illustrated in FIGS. 1 to 15, the first transparent adhesive member provided in the organic light emitting display device is replaced with a thickness variation member, and a position of the touch electrode part is changed.

Referring to FIGS. 17 and 18, an organic light emitting display device 100 according to the present embodiment may include a substrate 110, a pixel array layer 120, an encapsulation layer 130, a thickness variation member 150, and a touch electrode part 170.

Each of the pixel array layer 120 and the encapsulation layer 130 is the same as the above-described example, and thus, their repetitive descriptions are omitted.

The thickness variation member 150 may be provided between the encapsulation layer 130 and the touch electrode part 170, and a thickness of the thickness variation member 150 may vary according to a touch force (or a touch pressure) applied to the touch electrode part 170.

The thickness variation member 150 according to an embodiment may be formed of an elastic material. For example, the elastic material may be acrylic resin, olefin resin, synthetic rubber, elastic silicon, or a compound of two or more materials thereof, but is not limited thereto.

The thickness variation member 150 according to an embodiment may be an elastic dielectric where a thickness displacement (or a thickness variation) "ΔT" based on a user touch force occurs. The thickness variation member 150 including the elastic dielectric may have an elastic coefficient for the thickness displacement, and/or a high dielectric constant of three or more for a variation of a capacitance caused by the thickness displacement, and/or a light transmittance of 90% or more for transmitting light emitted from each pixel SP, and moreover, may have an adhesive force so as to be adhered to each of the encapsulation layer 130 and the touch electrode part 170. For example, the thickness variation member 150 may include an OCA, an OCR, and/or the like. The thickness variation member 150 may include a photo-curable polymer and a photo-curing agent and may have an elastic coefficient based on a weight ratio of the photo-curing agent.

The thickness variation member 150 may be disposed between the second electrode E2 of the pixel array layer 120 and the touch electrode part 170 to have a high dielectric constant, and thus, a capacitance may be generated between the touch electrode TE of the touch electrode part 170 and the second electrode E2. The capacitance, as illustrated in FIG. 6, may increase as the distance d between the second electrode E2 and the touch electrode TE is reduced according to a user touch force. A method of sensing a variation of a capacitance is as described above, and thus, its repetitive description is omitted.

Optionally, the thickness variation member 150 may be attached on a front surface of the encapsulation layer 130 by the first transparent adhesive member.

Figure 19:
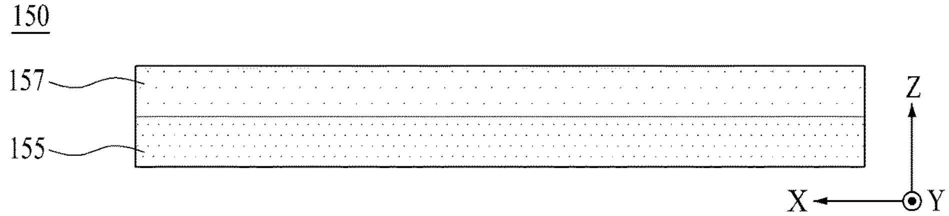
FIG. 19 is a cross-sectional view for describing a thickness variation member illustrated in FIGS. 17 and 18.

In addition, as illustrated in FIG. 19, the thickness variation member 150 according to an embodiment may include a first elastic dielectric layer 155 and a second elastic dielectric layer 157 having an elastic force and having different stiffness.

Each of the first and second elastic dielectric layers 155 and 157 may include a photo-curable polymer and a photo-curing agent. In this case, the first elastic dielectric layer 155 may have a first elastic coefficient depending on a first weight ratio of the photo-curing agent, and the second elastic dielectric layer 157 may have a second elastic coefficient lower than the first elastic coefficient due to a second weight ratio lower than the first weight ratio of the photo-curing agent included in the first elastic dielectric layer 155.

In each of the first and second elastic dielectric layers 155 and 157, as an elastic coefficient becomes higher, a slope value of a thickness variation based on the same load may be lowered. Therefore, since the first and second elastic dielectric layers 155 and 157 have different elastic coefficients, the first and second elastic dielectric layers 155 and 157 may have different thickness variations in response to the same load (or touch force). That is, since the second elastic dielectric layer 157 has the second elastic coefficient which is relatively low, the second elastic dielectric layer 157 may have a thickness variation greater than that of first elastic dielectric layer 155 in response to the same touch force. Therefore, the second elastic dielectric layer 157 having a relatively low elastic coefficient may be disposed adjacent to a touch surface (i.e., the cover window 300), for enhancing a sensing sensitivity of a weak force touch. Accordingly, the thickness variation member 150 according to an embodiment may have a stacked structure including the first and second elastic dielectric layers 155 and 157 which have different thickness variations in response to the same touch force, and thus, a capacitance generated based on a touch force between the second electrode E2 and the touch electrode TE of the touch electrode part 170 may linearly vary.

In the present embodiment, the thickness variation member 150 according to an embodiment has been described above as being configured with the first and second elastic dielectric layers 155 and 157, but is not limited thereto. In other embodiments, the thickness variation member 150 may include a plurality of elastic dielectric layers which are stacked in two or more layers, and the plurality of elastic dielectric layers may have different elastic coefficients. For example, the elastic coefficient may increase from layer to layer in the stack, such that the layer closest to the touch surface has the lowest elastic coefficient. In this case, in the present embodiment, a capacitance generated based on a touch force between the second electrode E2 and the touch electrode TE may linearly vary.

In the present embodiment, the organic light emitting display device 100 may further include a barrier film 190 disposed between the touch electrode part 170 and the cove window 300.

The barrier film 190 may have a barrier characteristic of preventing penetration of water or oxygen from the outside. The barrier film 190 may be attached on a front surface of the touch electrode part 170 by a second transparent adhesive member 160 and may be attached on a rear surface of the cover window 300 by a third transparent adhesive member 310. The barrier film 190 may include one of polyethyleneterephthalate, polyethersulfone, polyimide, polynorbomene, polycarbonate, polyethylenenaphthalate, etc.

In the present embodiment, a user touch may be sensed by the same method as a method performed by the electronic device illustrated in FIGS. 1 to 15, and thus, a repetitive description is omitted.

Therefore, in the present embodiment, the thickness variation member 150 may be provided on the encapsulation layer 130, and thus, a distance between the second electrode E2 and the touch electrode part 170 may be set to be relatively short. Accordingly, in the present embodiment, a capacitance of the touch electrode part 170 based on a distance change between the second electrode E2 and the touch electrode part 170 caused by a user touch may greatly vary, thereby providing the same effect as that of the electronic device illustrated in FIGS. 1 to 15 and increasing a touch sensing sensitivity.

Figure 20:
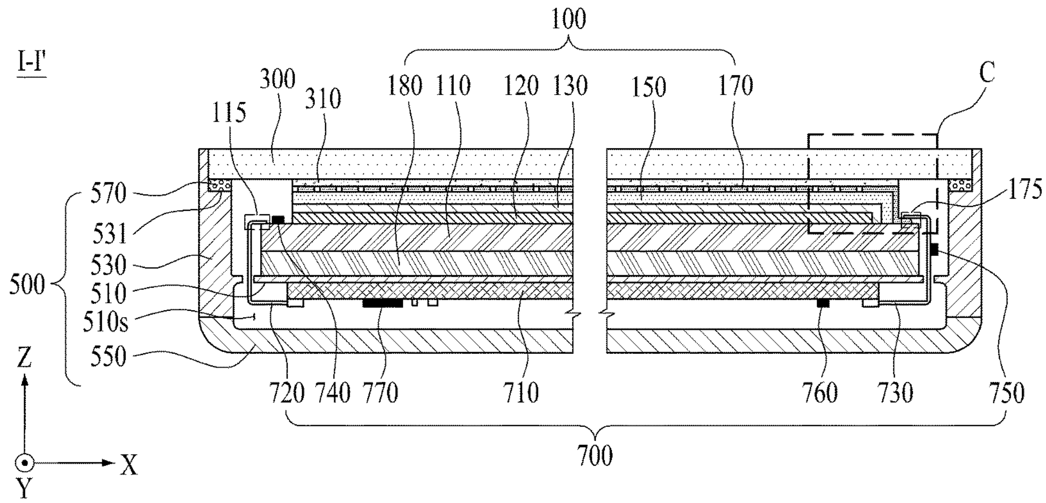
FIG. 20 is a cross-sectional view taken along line I-I' illustrated in FIG. 1.
Figure 21:
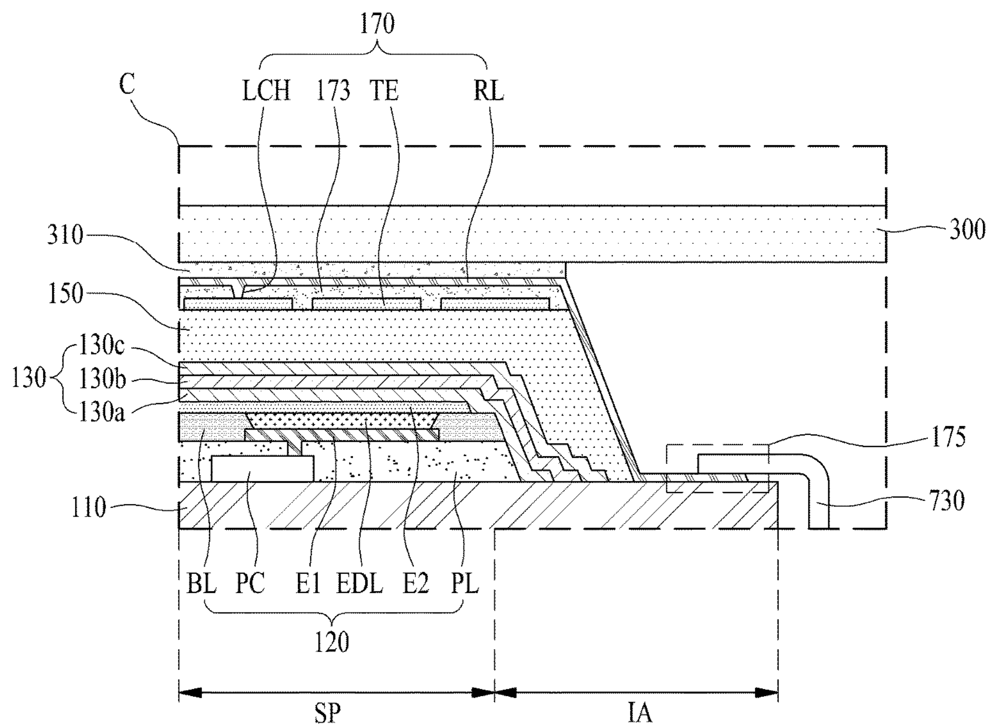
FIG. 21 is an enlarged view of portion C illustrated in FIG. 20.

FIG. 20 is a cross-sectional view taken along line I-I' illustrated in FIG. 1, and FIG. 21 is an enlarged view of portion C illustrated in FIG. 20. FIGS. 20 and 21 illustrate an example where in the electronic device illustrated in FIGS. 1 to 15, a thickness variation member is provided on a front surface of the pixel array layer provided in the organic light emitting display device, and a direct touch electrode layer is deposited on a front surface of the thickness variation member.

Referring to FIGS. 20 and 21, an organic light emitting display device 100 according to the present embodiment may include a substrate 110, a pixel array layer 120, an encapsulation layer 130, a thickness variation member 150, and a touch electrode part 170.

Each of the pixel array layer 120 and the encapsulation layer 130 is the same as the above-described example, and thus, their repetitive descriptions are omitted.

The thickness variation member 150 may be provided between the encapsulation layer 130 and the touch electrode part 170, and a thickness of the thickness variation member 150 may vary according to a touch force (or a touch pressure) applied to the touch electrode part 170.

The thickness variation member 150 according to an embodiment may be formed of an elastic material or an elastic dielectric material identically to the thickness variation member of the organic light emitting display device illustrated in FIGS. 17 and 18, and thus, its repetitive description is omitted.

The thickness variation member 150 according to an embodiment, as illustrated in FIG. 19, may include a first elastic dielectric layer 155 and a second elastic dielectric layer 157 having an elastic force and having different stiffness.

The touch electrode part 170 according to an embodiment, as illustrated in FIG. 5, may include a plurality of touch electrodes TE1 to TEn, an insulation layer 173, a plurality of touch routing lines RL, and a touch pad part 175.

The plurality of touch electrodes TE1 to TEn may be arranged at certain intervals along a first direction X and a second direction Y of the substrate 110. The plurality of touch electrodes TE1 to TEn according to an embodiment may include indium tin oxide (ITO), indium zinc oxide (IZO), indium zinc tin oxide (IZTO), indium cesium oxide (ICO), or indium tungsten oxide (IWO) which is a transparent conductive material such as transparent conductive oxide (TCO). Here, the plurality of touch electrodes TE1 to TEn may each be formed of an amorphous transparent conductive material, for example, amorphous ITO. That is, each of the plurality of touch electrodes TE1 to TEn may be formed of an amorphous transparent conductive material through a low temperature metal deposition process using a process temperature of less than 100 degrees C., for preventing or minimizing damage of the pixel array layer 120 caused by a process temperature for forming the plurality of touch electrodes TE1 to TEn. Here, in a case where each of the plurality of touch electrodes TE1 to TEn is formed of the crystalline transparent conductive material, the pixel array layer 120 is damaged by a high temperature thermal treatment process performed for securing a low resistance value, and thus, in the present embodiment, each of the plurality of touch electrodes TE1 to TEn may be formed of an amorphous transparent conductive material through the low temperature metal deposition process.

The insulation layer 173 may be provided to cover a whole front surface of the thickness variation member 150 including each of the plurality of touch electrodes TE1 to TEn.

The plurality of touch routing lines RL may be respectively connected to the plurality of touch electrodes TE1 to TEn in a one-to-one relationship and may connect a plurality of touch routing lines RL to the touch pad part 175.

The plurality of touch routing lines RL according to an embodiment may be provided on the insulation layer 173 to overlap at least one touch electrode TE disposed in the second direction Y and may be respectively connected to, through a line contact hole LCH, the plurality of touch electrodes TE1 to TEn arranged in the second direction Y in a one-to-one relationship. One end of each of the plurality of touch routing lines RL may be electrically connected to a corresponding touch electrode TE, and the other end of each of the plurality of touch routing lines RL may be electrically connected to the touch pad part 175 through (in other words, by extending along) a side surface of the thickness variation member 150 and a front surface of the substrate 110.

Optionally, the plurality of touch routing lines RL according to an embodiment may be directly provided on the front surface of the thickness variation member 150 and may be arranged on the same layer as the touch electrode TE. For example, the plurality of touch routing lines RL may be directly provided on the front surface of the thickness variation member 150 to be adjacent to the touch electrodes TE with respect to the first direction X and may be respectively connected to the plurality of touch electrodes TE1 to TEn. That is, the plurality of touch routing lines RL may be patterned simultaneously with the plurality of touch electrodes TE1 to TEn, and thus, may be provided on the same layer as the plurality of touch electrodes TE1 to TEn on the front surface of the thickness variation member 150. In this case, the insulation layer 173 may be provided to cover the front surface of the thickness variation member 150 including the plurality of touch electrodes TE1 to TEn and the plurality of touch routing lines RL, or may be omitted. The line contact hole LCH may be omitted.

The touch pad part 175 may include a plurality of touch pad electrodes arranged in the other edge of the substrate 110. Here, the other edge of the substrate 110 may be defined as an edge other than an edge of the substrate 110 where the panel pad part 115 is provided. The plurality of touch pad electrodes may be respectively connected to the other ends of the plurality of touch routing lines RL in a one-to-one relationship. The touch pad part 175 may be connected to the touch driving circuit 750 through the second flexible printed circuit cable 730.

The touch electrode part 170 according to an embodiment, as illustrated in FIG. 11, may include a plurality of first touch electrodes Tx_1 to Tx_n, a plurality of second touch electrodes Ry_1 to Ry_m, and the touch pad part 175.

Each of the plurality of first touch electrodes Tx_1 to Tx_n may be used as a force driving electrode or a touch driving electrode for sensing a user touch, or optionally, may be used as a force sensing electrode for sensing a user force touch.

Except that each of the plurality of first touch electrodes Tx_1 to Tx_n according to an embodiment is directly provided on the front surface of the thickness variation member 150, the plurality of first touch electrodes Tx_1 to Tx_n are the same as the above-described example, and thus, their repetitive descriptions are omitted. However, since the plurality of first touch electrodes Tx_1 to Tx_n are directly provided on the front surface of the thickness variation member 150, as described above, the plurality of first touch electrodes Tx_1 to Tx_n may each be formed of an amorphous transparent conductive material.

Each of the plurality of second touch electrodes Ry_1 to Ry_m may be used as a force sensing electrode or a touch sensing electrode for sensing a user touch, or optionally, may be used as a force sensing electrode for sensing a user force touch.

Except that each of the plurality of second touch electrodes Ry_1 to Ry_m according to an embodiment is directly provided on the front surface of the thickness variation member 150, the plurality of second touch electrodes Ry_1 to Ry_m are the same as the above-described example, and thus, their repetitive descriptions are omitted. However, since the plurality of second touch electrodes Ry_1 to Ry_m are directly provided on the front surface of the thickness variation member 150, as described above, the plurality of second touch electrodes Ry_1 to Ry_m may each be formed of an amorphous transparent conductive material.

The touch pad part 175 may include a plurality of first touch pad electrodes and a plurality of second touch pad electrodes arranged in the other edge of the substrate 110. The plurality of first touch pad electrodes may be respectively connected to the other ends of the plurality of first touch routing lines RL1_1 to RL1_n in a one-to-one relationship. The plurality of second touch pad electrodes may be respectively connected to the other ends of the plurality of second touch routing lines RL2_1 to RL2_m in a one-to-one relationship. Here, the other edge of the substrate 110 may be defined as an edge of a non-display area IA other than a non-display area of the substrate 110 where the panel pad part 115 is provided. The touch pad part 175 may be connected to the touch driving circuit 750 through the second flexible printed circuit cable 730.

By using the same touch sensing method as a touch sensing method performed by the touch driving circuit illustrated in FIGS. 1 to 15, the touch driving circuit 750 may simultaneously sense a force capacitance variation caused by a distance change between the second electrode E2 and the touch electrode part 170 caused by a thickness variation of the thickness variation member 150 caused by a user touch and a touch capacitance variation between the touch electrode part 170 and a user finger to generate electrode-based sensing raw data and may supply the electrode-based sensing raw data to the touch control circuit 760. Also, by using the same method as the above-described example, the touch control circuit 760 may divide the electrode-based sensing raw data into touch raw data and force raw data to generate 2D touch information and/or 3D touch information.

In addition, the organic light emitting display device 100 according to the present embodiment may further include a barrier film disposed between the thickness variation member 150 and the touch electrode part 170 or between the touch electrode part 170 and the cover window 300. The barrier film may have a barrier characteristic of preventing penetration of water or oxygen from the outside and may be formed of the same material as that of the barrier film 190 illustrated in FIGS. 17 and 18.

In the present embodiment, since the touch electrode TE of the touch electrode part 170 is directly provided on the front surface of the thickness variation member 150 and the 2D touch information and/or the 3D touch information are/is by sensing a user touch, the same effect as that of the electronic device illustrated in FIGS. 1 to 15 is obtained. Also, since the touch electrode TE of the touch electrode part 170 is directly provided on the front surface of the thickness variation member 150, a thickness is reduced, and a manufacturing process is simplified.

In FIG. 1, a smartphone is illustrated as an example of the electronic device according to the present embodiment, but the present embodiment is not limited thereto. The present embodiment may be applied to electronic notebooks, e-books, portable multimedia players (PMPs), navigation devices, mobile phones, tablet personal computers, smartwatches, watch phones, wearable devices, portable electronic devices such as mobile communication terminals, televisions (TVs), notebook computers, monitors, cameras, camcorders, appliances including a display, etc.

As described above, according to the embodiments of the present disclosure, a touch force may be sensed even without a separate force sensor and a separate force touch driving IC for sensing a touch force, thereby reducing a thickness of an electronic device, the number of elements, and the manufacturing cost.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electronic device having a force touch function, the electronic device comprising:

a substrate;

a first electrode on the substrate;

a light emitting device layer including a light emitting layer on the first electrode;

a second electrode on the light emitting device layer;

a touch electrode part on the second electrode; and a thickness variation member between the second electrode and the touch electrode part, wherein a distance between the second electrode and the touch electrode part is changeable according to a touch force applied to the touch electrode part, wherein the thickness variation member comprises a plurality of elastic dielectric layers stacked in two or more layers, wherein the plurality of elastic dielectric layers have different elastic coefficients, wherein an elastic dielectric layer of the plurality of elastic dielectric layers that is closer to a touch surface of the electronic device has a lower elastic coefficient than an elastic dielectric layer of the plurality of elastic dielectric layers that is farther away from the touch surface, and wherein each of the plurality of elastic dielectric layers extends across an entirety of the second electrode.

2. The electronic device of claim 1, wherein:

the thickness variation member comprises an elastic barrier film; and the elastic barrier film comprises an elastic film and a barrier film provided on the elastic film.

3. The electronic device of claim 1, wherein:

the thickness variation member comprises an elastic supporting member separating the touch electrode part from the second electrode; and the elastic supporting member is arranged such that an air layer is between the touch electrode part and the second electrode.

4. The electronic device of claim 1, further comprising:

an encapsulation layer covering the second electrode, wherein the thickness variation member is between the encapsulation layer and the touch electrode part.

5. The electronic device of claim 4, wherein the touch electrode part comprises:

a transparent substrate attached on the thickness variation member;

a plurality of touch electrodes on the transparent substrate;

a plurality of touch routing lines respectively connected to the plurality of touch electrodes in a one-to-one relationship; and a touch pad part on the transparent substrate and connected to the plurality of touch routing lines in a one-to-one relationship, wherein the plurality of touch electrodes overlap the second electrode with the thickness variation member therebetween.

6. The electronic device of claim 4, wherein the touch electrode part comprises:

a plurality of touch electrodes directly on the thickness variation member;

a plurality of touch routing lines respectively connected to the plurality of touch electrodes in a one-to-one relationship; and a touch pad part on the substrate and connected to the plurality of touch routing lines in a one-to-one relationship, wherein the plurality of touch electrodes overlap the second electrode with the thickness variation member therebetween.

7. The electronic device of claim 4, wherein the touch electrode part comprises:

a transparent substrate attached on the thickness variation member;

a plurality of first touch electrodes on the transparent substrate;

a plurality of second touch electrodes separated from the plurality of first touch electrodes and adjacent to the plurality of first touch electrodes on the transparent substrate;

a plurality of first touch routing lines respectively connected to the plurality of first touch electrodes in a one-to-one relationship;

a plurality of second touch routing lines respectively connected to the plurality of second touch electrodes in a one-to-one relationship; and a touch pad part on the transparent substrate and connected to the plurality of first touch routing lines and the plurality of second touch routing lines in a one-to-one relationship, wherein the plurality of first touch electrodes overlap the second electrode with the thickness variation member therebetween, and wherein the plurality of second touch electrodes overlap the second electrode with the thickness variation member therebetween.

8. The electronic device of claim 4, wherein the touch electrode part comprises:

a plurality of first touch electrodes directly on the thickness variation member;

a plurality of second touch electrodes separated from the plurality of first touch electrodes, directly on the thickness variation member, and adjacent to the plurality of first touch electrodes;

a plurality of first touch routing lines respectively connected to the plurality of first touch electrodes in a one-to-one relationship;

a plurality of second touch routing lines respectively connected to the plurality of second touch electrodes in a one-to-one relationship; and a touch pad part on the substrate and connected to the plurality of first touch routing lines and the plurality of second touch routing lines in a one-to-one relationship, wherein the plurality of first touch electrodes overlap the second electrode with the thickness variation member therebetween, and wherein the plurality of second touch electrodes overlap the second electrode with the thickness variation member therebetween.

9. The electronic device of claim 1, further comprising:

an organic light emitting display device on the substrate, the organic light emitting display device including the light emitting device layer and the touch electrode part;

a housing accommodating the organic light emitting display device;

a cover window covering a front surface of the organic light emitting display device, the cover window being supported by the housing; and an elastic member between the cover window and the housing.

10. The electronic device of claim 5, further comprising:

a touch driving circuit connected to the touch pad part, wherein the touch driving circuit is configured to:

simultaneously supply a touch driving pulse to the plurality of touch electrodes through the plurality of touch routing lines and sense capacitance variations of the plurality of touch electrodes through the plurality of touch routing lines, or wherein the touch driving circuit is configured to:

during a first touch sensing period:

supply a touch driving pulse to the plurality of touch electrodes through the plurality of touch routing lines; and sense capacitance variations of the plurality of touch electrodes through the plurality of touch routing lines, and during a second touch sensing period:

supply the touch driving pulse to the plurality of touch electrodes through the plurality of touch routing lines; and sense capacitance variations of the plurality of touch electrodes through the plurality of touch routing lines.

11. The electronic device of claim 7, further comprising:

a touch driving circuit connected to the touch pad part, wherein the touch driving circuit is configured to:

sequentially supply a touch driving pulse to the plurality of first touch electrodes through the plurality of first touch routing lines;

immediately after the touch driving pulse is supplied to the plurality of first touch electrodes, sense a capacitance variation of a corresponding first touch electrode through a corresponding first touch routing line; and sequentially supply the touch driving pulse to the plurality of second touch electrodes through the plurality of second touch routing lines; and immediately after the touch driving pulse is supplied to the plurality of second touch electrodes, sense a capacitance variation of a corresponding second touch electrode through a corresponding second touch routing line.

12. The electronic device of claim 7, further comprising:

a touch driving circuit connected to the touch pad part, wherein the touch driving circuit is configured to:

during a first touch sensing period:

sequentially supply a touch driving pulse to the first and second touch electrodes through the first and second touch routing lines; and immediately after the touch driving pulse is supplied, sense a capacitance variation of a corresponding touch electrode through a corresponding touch routing line; and during a second touch sensing period:

sequentially supply the touch driving pulse to the first and second touch electrodes through the first and second touch routing lines; and immediately after the touch driving pulse is supplied, sense a capacitance variation of a corresponding touch electrode through a corresponding touch routing line.

13. The electronic device of claim 7, further comprising:

a touch driving circuit connected to the touch pad part, wherein:

the touch driving circuit is configured to:

during a first touch sensing period:

sequentially supply a touch driving pulse to the plurality of first touch electrodes through the plurality of first touch routing lines; and individually sense capacitance variations between corresponding first touch electrodes and second touch electrodes through the plurality of second touch routing lines; and during a second touch sensing period:

simultaneously supply the touch driving pulse to the plurality of second touch electrodes through the plurality of second touch routing lines; and immediately after the touch driving pulse is supplied, individually sense capacitance variations of the plurality of second touch electrodes through the plurality of second touch routing lines; or the touch driving circuit is configured to:

during a first touch sensing period:

sequentially supply a touch driving pulse to the plurality of first touch electrodes through the plurality of first touch routing lines; and individually sense capacitance variations between corresponding first touch electrodes and second touch electrodes through the plurality of second touch routing lines; and during a second touch sensing period:

sequentially supply the touch driving pulse to the first and second touch electrodes through the first and second touch routing lines; and immediately after the touch driving pulse is supplied, sense a capacitance variation of a corresponding touch electrode through a corresponding touch routing line.

* * * * *